(12) United States Patent
Dole et al.

(10) Patent No.: US 12,217,972 B2
(45) Date of Patent: Feb. 4, 2025

(54) MULTI-STATE PULSING FOR ACHIEVING A BALANCE BETWEEN BOW CONTROL AND MASK SELECTIVITY

(71) Applicant: Lam Research Corporation, Fremont, CA (US)

(72) Inventors: Nikhil Dole, Castro Valley, CA (US); Merrett Tinlok Wong, San Carlos, CA (US); Eric Hudson, Berkeley, CA (US); Sangheon Lee, South San Francisco, CA (US); Xiaoqiang Yao, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 339 days.

(21) Appl. No.: 17/779,520

(22) PCT Filed: Dec. 3, 2020

(86) PCT No.: PCT/US2020/063142
§ 371 (c)(1),
(2) Date: May 24, 2022

(87) PCT Pub. No.: WO2021/118862
PCT Pub. Date: Jun. 17, 2021

(65) Prior Publication Data
US 2023/0005717 A1 Jan. 5, 2023

Related U.S. Application Data

(60) Provisional application No. 62/961,358, filed on Jan. 15, 2020, provisional application No. 62/948,180, filed on Dec. 13, 2019.

(51) Int. Cl.
*H01L 21/311* (2006.01)
*H01J 37/32* (2006.01)
*H01L 21/3065* (2006.01)

(52) U.S. Cl.
CPC .. *H01L 21/31144* (2013.01); *H01J 37/32146* (2013.01); *H01J 37/32165* (2013.01);
(Continued)

(58) Field of Classification Search
None
See application file for complete search history.

(56) References Cited

U.S. PATENT DOCUMENTS 10,002,746 B1 * 6/2018 Marakhtanov ...... H01J 37/3255
2015/0050807 A1 2/2015 Wu et al.
(Continued)

OTHER PUBLICATIONS

ISR & WO PCT/US2020/063142, dated Mar. 18, 2021, 15 pages.

*Primary Examiner* — Jiong-Ping Lu
(74) *Attorney, Agent, or Firm* — PENILLA IP, APC

(57) ABSTRACT

A method for multi-state pulsing to achieve a balance between bow control and mask selectivity is described. The method includes generating a primary radio frequency (RF) signal. The primary RF signal pulses among three states including a first state, a second state, and a third state. The method further includes generating a secondary RF signal. The secondary RF signal pulses among the three states. During the first state, the primary RF signal has a power level that is greater than a power level of the secondary RF signal. Also, during the second state, the secondary RF signal has a power level that is greater than a power level of the primary RF signal. During the third state, power levels of the primary and secondary RF signals are approximately equal.

26 Claims, 13 Drawing Sheets

(52) U.S. Cl.
CPC .... *H01J 37/32183* (2013.01); *H01L 21/3065* (2013.01); *H01L 21/31116* (2013.01); *H01J 37/32174* (2013.01); *H01J 2237/334* (2013.01); *H01J 2237/3346* (2013.01)

(56) References Cited

U.S. PATENT DOCUMENTS

| | | |
|---|---|---|
| 2017/0330732 A1 | 11/2017 | Valcore, Jr. et al. |
| 2018/0025930 A1 | 1/2018 | Augustyniak et al. |
| 2018/0211845 A1 | 7/2018 | Su et al. |
| 2019/0074191 A1 | 3/2019 | Nagatomo et al. |

\* cited by examiner (System for 3-State Pulsing)

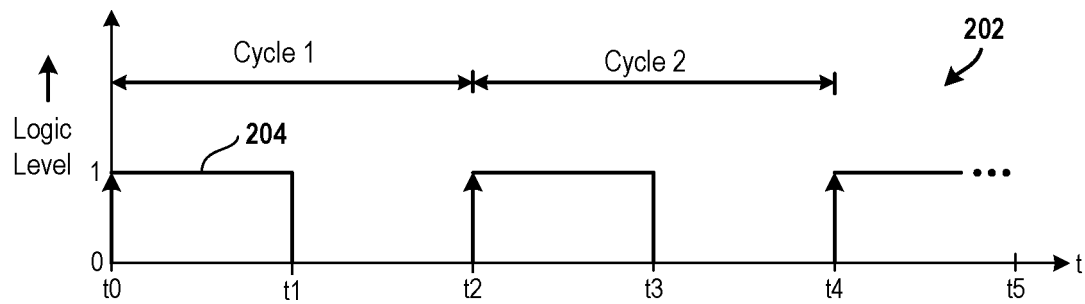
FIG. 2A
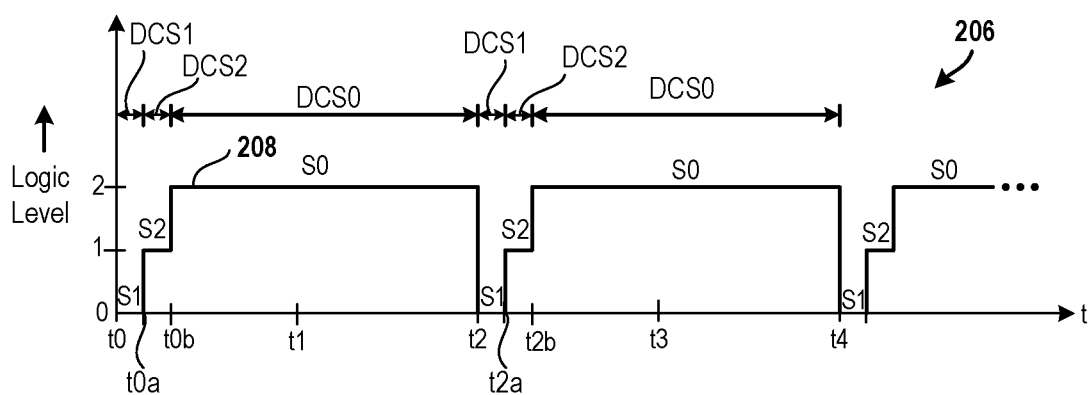
FIG. 2B
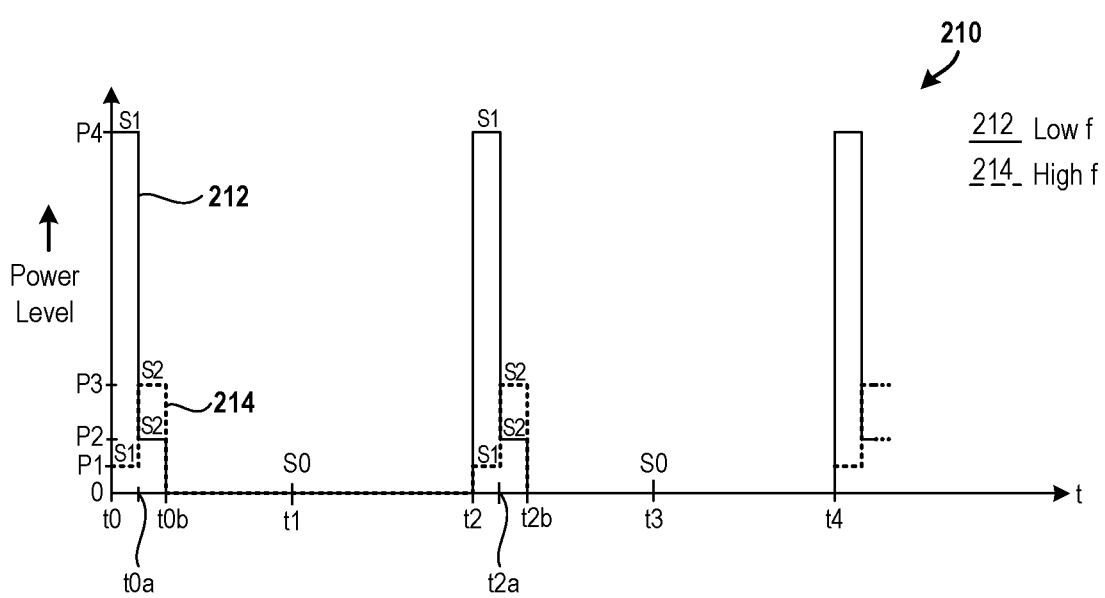
FIG. 2C (S1-S2-S0)

(S1-S2-S0-Different Duty Cycle
than Fig. 2C)

(Zoom-in of Fig. 2C)

(Zoom-in of Fig. 2C)

(S1-S0-S2)

(S1-S0-S2 with Different Duty Cycles than Fig. 4C)

(Zoom – in of Fig. 4C)

(Zoom – in of Fig. 4C)

(Balance Between Passivation of
Mask Layer and SiN Layer)

(Zoom-in of Fig. 7B)

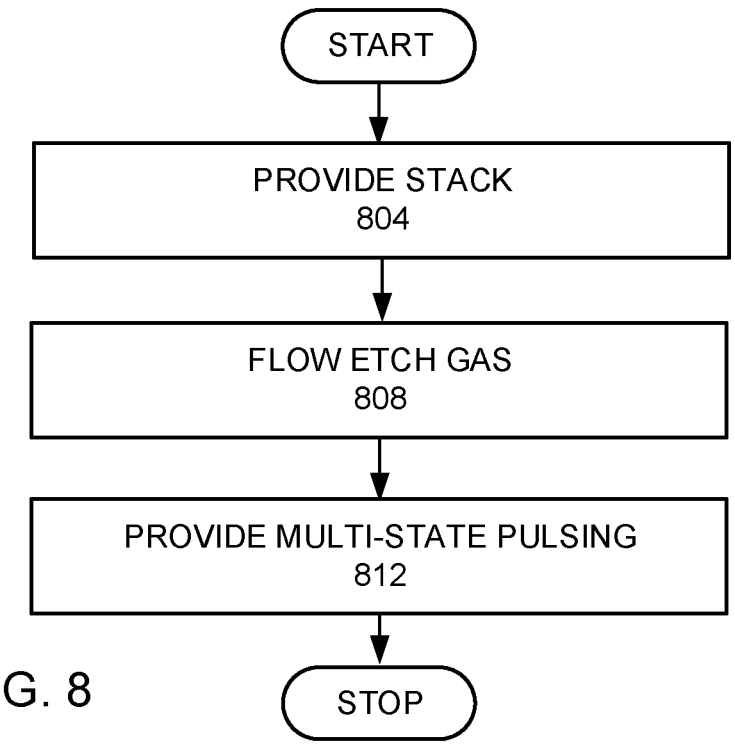
FIG. 8
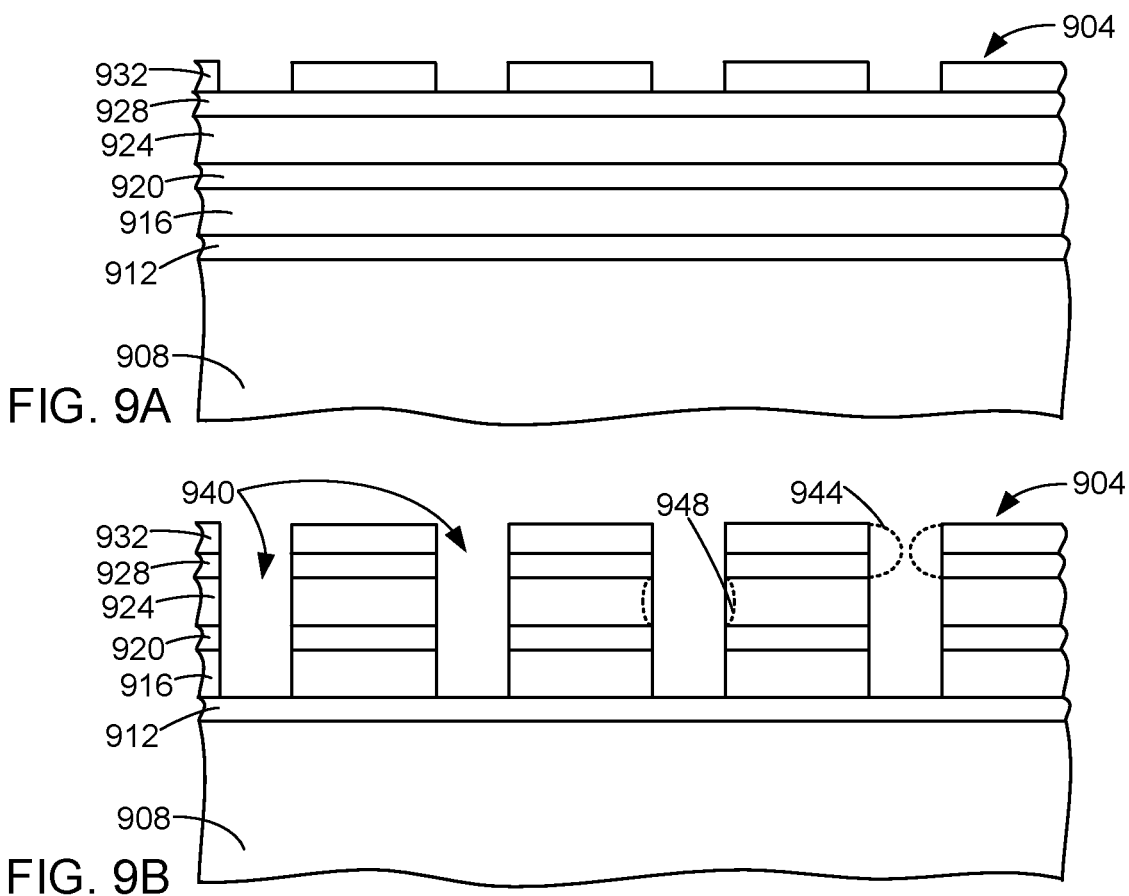
FIG. 9A
FIG. 9B

MULTI-STATE PULSING FOR ACHIEVING A BALANCE BETWEEN BOW CONTROL AND MASK SELECTIVITY

CLAIM OF PRIORITY

This application is a national stage filing of and claims priority, under 35 U.S.C. § 371, to PCT/US20/63142, filed on Dec. 3, 2020, and titled "MULTI-STATE PULSING FOR ACHIEVING A BALANCE BETWEEN BOW CONTROL AND MASK SELECTIVITY", which claims the benefit of and priority, under 35 U.S.C. § 119 (e), to U.S. Provisional Patent Application No. 62/948,180, filed on Dec. 13, 2019, and to U.S. Provisional Patent Application No. 62/961,358 filed on Jan. 15, 2020, of which are incorporated by reference herein in their entirety.

FIELD

The embodiments described in the present disclosure relate to systems and methods for multi-state pulsing for achieving a balance between bow control and mask selectivity.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A radiofrequency (RF) generator generates an RF signal and supplies the RF signal via a match to a plasma reactor. The plasma reactor has a semiconductor wafer that is etched when the RF signal is supplied and an etchant gas is supplied to the plasma reactor. However, a desirable selectivity associated with the semiconductor wafer is not achieved while the semiconductor wafer is etched.

It is in this context that embodiments described in the present disclosure arise.

SUMMARY

Embodiments of the disclosure provide apparatus, methods and computer programs for multi-state pulsing for achieving a balance between bow control and mask selectivity. It should be appreciated that the present embodiments can be implemented in numerous ways, e.g., a process, an apparatus, a system, a piece of hardware, or a method on a computer-readable medium. Several embodiments are described below.

In one embodiment, a three-state radiofrequency (RF) pulsing method that breaks a trade-off between sidewall polymer passivation and mask selectivity is described. The trade-off between sidewall polymer passivation and mask selectivity creates a limitation in achieving a pitch to further limit a device size. As an example, the three-state RF pulsing method includes synchronized pulsing of a low frequency RF generator periodically among three states and of a high frequency RF generator periodically among the three states.

In one embodiment, a method for multi-state pulsing to achieve a balance between bow control and mask selectivity is described. The method includes generating a primary RF signal. The primary RF signal pulses among three states including a first state, a second state, and a third state. The method further includes generating a secondary RF signal. The secondary RF signal pulses among the three states. During the first state, the primary RF signal has a power level that is greater than a power level of the secondary RF signal. Also, during the second state, the secondary RF signal has a power level that is greater than a power level of the primary RF signal. During the third state, power levels of the primary and secondary RF signals are approximately equal.

In an embodiment, a controller is described. The controller includes a processor that controls a primary RF generator to generate a primary RF signal. The processor controls the primary RF generator to pulse the primary RF signal among three states including a first state, a second state, and a third state. The processor also controls a secondary RF generator to generate a secondary RF signal. The processor controls the secondary RF generator to pulse the secondary RF signal among the three states. During the first state, the primary RF signal has a power level that is greater than a power level of the secondary RF signal. During the second state, the secondary RF signal has a power level that is greater than a power level of the primary RF signal. During the third state, power levels of the primary and secondary RF signals are approximately equal. The controller includes a memory device coupled to the processor.

In an embodiment, the processor controls a duty cycle of the first state to be less than a duty cycle of the third state. The processor also controls a duty cycle of the second state to be less than the duty cycle of the third state.

In one embodiment, the power level of the primary RF signal during the first state is greater than the power level of the secondary RF signal during the first state by at least six times and at most ten times.

In an embodiment, the power level of the primary RF signal during the second state is at least twenty percent and at most less than one hundred percent of the power level of the secondary RF signal during the second state.

In an embodiment, a system is described. The system includes a primary RF generator configured to generate a primary RF signal. The system further includes a secondary RF generator configured to generate a secondary RF signal. The system includes an impedance matching circuit coupled to the primary RF generator via a first RF cable and coupled to the secondary RF generator via a second RF cable. The impedance matching circuit receives the primary RF signal via the first RF cable and receives the secondary RF signal via the second RF cable to output a modified RF signal. The system also includes a plasma chamber coupled to the impedance matching circuit to receive the modified RF signal. The system includes a computer coupled to the RF generator. The computer controls the primary RF generator to pulse the primary RF signal among three states including a first state, a second state, and a third state. The computer further controls the secondary RF generator to pulse the secondary RF signal among the three states. During the first state, the primary RF signal has a power level that is greater than a power level of the secondary RF signal. Also, during the second state, the secondary RF signal has a power level that is greater than a power level of the primary RF signal. During the third state, power levels of the primary and secondary RF signals are approximately equal.

In an embodiment, the computer controls a duty cycle of the first state to be less than a duty cycle of the third state. The computer controls a duty cycle of the second state to be less than the duty cycle of the third state.

In one embodiment, the power level of the primary RF signal during the first state is greater than the power level of the secondary RF signal during the first state by at least six times and at most ten times.

In an embodiment, the power level of the primary RF signal during the second state is at least twenty percent and at most less than one hundred percent of the power level of the secondary RF signal during the second state.

In one embodiment, a system is described. The system includes a primary RF generator configured to generate a primary RF signal at a first frequency range. The system further includes a secondary RF generator configured to generate a secondary RF signal at a second frequency range. The system includes an impedance matching circuit coupled to the primary RF generator via a first RF cable and coupled to the secondary RF generator via a second RF cable. The impedance matching circuit receives the primary RF signal via the first RF cable and receives the secondary RF signal via the second RF cable to output a modified RF signal. The system includes a plasma chamber coupled to the impedance matching circuit to receive the modified RF signal. The system further includes a gas source in fluid connection to the plasma chamber. The gas source includes a tungsten-containing gas source and an etch component gas source. The system includes a computer coupled to the RF generator. The computer controls the tungsten-containing gas source and the etch component gas source. The computer further controls the primary RF generator to pulse the primary RF signal among at least three states including a first state, a second state, and a third state. The computer also controls control the secondary RF generator to pulse the secondary RF signal among the at least three states. During the second state, the primary RF signal has a power level that is less than 80% of a power level of the primary RF signal during the first state. Also, during the third state, the primary RF signal has a power level that is less than 20% of the power level of the primary RF signal during the second state. Further, during the third state, a power level of the secondary RF signal is less than 20% of a power level of the secondary RF signal during the second state. Gas is flowed from the tungsten-containing gas source and the etch component gas source during the first state, the second state, and the third state.

In an embodiment, the computer controls a duty cycle of the first state to be less than a duty cycle of the third state. The computer controls a duty cycle of the second state to be less than the duty cycle of the third state.

In one embodiment, a duty cycle of the first state ranges between three percent and twenty-five percent of a clock cycle of a clock signal.

Also, in an embodiment, a duty cycle of the second state ranges between three percent and fifty percent of the clock cycle of the clock signal.

In one embodiment, a duty cycle of the third state ranges between twenty-five percent and ninety-four percent of the clock cycle of the clock signal, and wherein a sum of the duty cycles of the first, second, and third states is equal to one-hundred percent of the clock cycle.

In an embodiment, the first frequency range is between 80 kHz and 14 MHz, inclusive, and wherein the second frequency range is between 15 MHz and 120 MHz, inclusive.

In one embodiment, the tungsten-containing gas is tungsten fluoride.

In an embodiment, the tungsten-containing gas is tungsten hexafluoride.

In one embodiment, a ratio of the power level of the primary RF signal during the first state to the power level of the secondary RF signal during the first state is greater than 1, and a ratio of the power level of the primary RF signal during the second state to the power level of the secondary RF signal during the second state is less than 1.

In an embodiment, the computer tunes the first state, the second state, and the third state to minimize necking and bowing with the metal fluoride or tungsten-containing passivant.

Some advantages of the herein described three-state RF pulsing method include achieving a shrinkage in a bow formed at a sidewall of a nitride layer by greater than approximately 1.5 nanometers (nm) while increasing the mask selectivity. For example, by achieving the shrinkage in the bow, the mask selectivity is increased by approximately 15% to 20% compared to mask selectivity achieved using two-state pulsing.

Additional advantages of the herein described systems and methods for multi-state pulsing include achieving the balance between bow control and mask selectivity. By pulsing each of the low frequency RF generator and the high frequency RF generator in three-states, the balance is achieved. For example, the low frequency RF generator is pulsed at a much greater power level compared to a power level of the high frequency RF generator during a first state. The high frequency RF generator is pulsed at a greater power level compared to a power level of the low frequency RF generator during a second state. The low and high frequency RF generators have a power level of approximately zero during the third state. By pulsing the low and high frequency RF generators in such a manner, the balance is achieved. Achieving the balance facilitates etching substrate features with a high aspect ratio.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 2A is an embodiment of a graph of a clock signal.

FIG. 2B is a diagram of an embodiment of a graph to illustrate an embodiment of a digital pulsed signal.

FIG. 2C is an embodiment of a graph to illustrate an embodiment of an RF signal generated by a low frequency RF generator and an embodiment of an RF signal generated by a high frequency RF generator.

FIG. 8 is a flow chart of another embodiment.

FIG. 9A is a schematic cross-sectional view of a stack processed according to the embodiment shown in FIG. 8.

FIG. 9B is a schematic cross-sectional view of a stack processed according to the embodiment shown in FIG. 8.

DETAILED DESCRIPTION

The following embodiments describe systems and methods for multi-state pulsing for achieving a balance between bow control and mask selectivity. It will be apparent that the present embodiments may be practiced without some or all of these specific details. In other instances, well known process operations have not been described in detail in order not to unnecessarily obscure the present embodiments.

Figure 1:
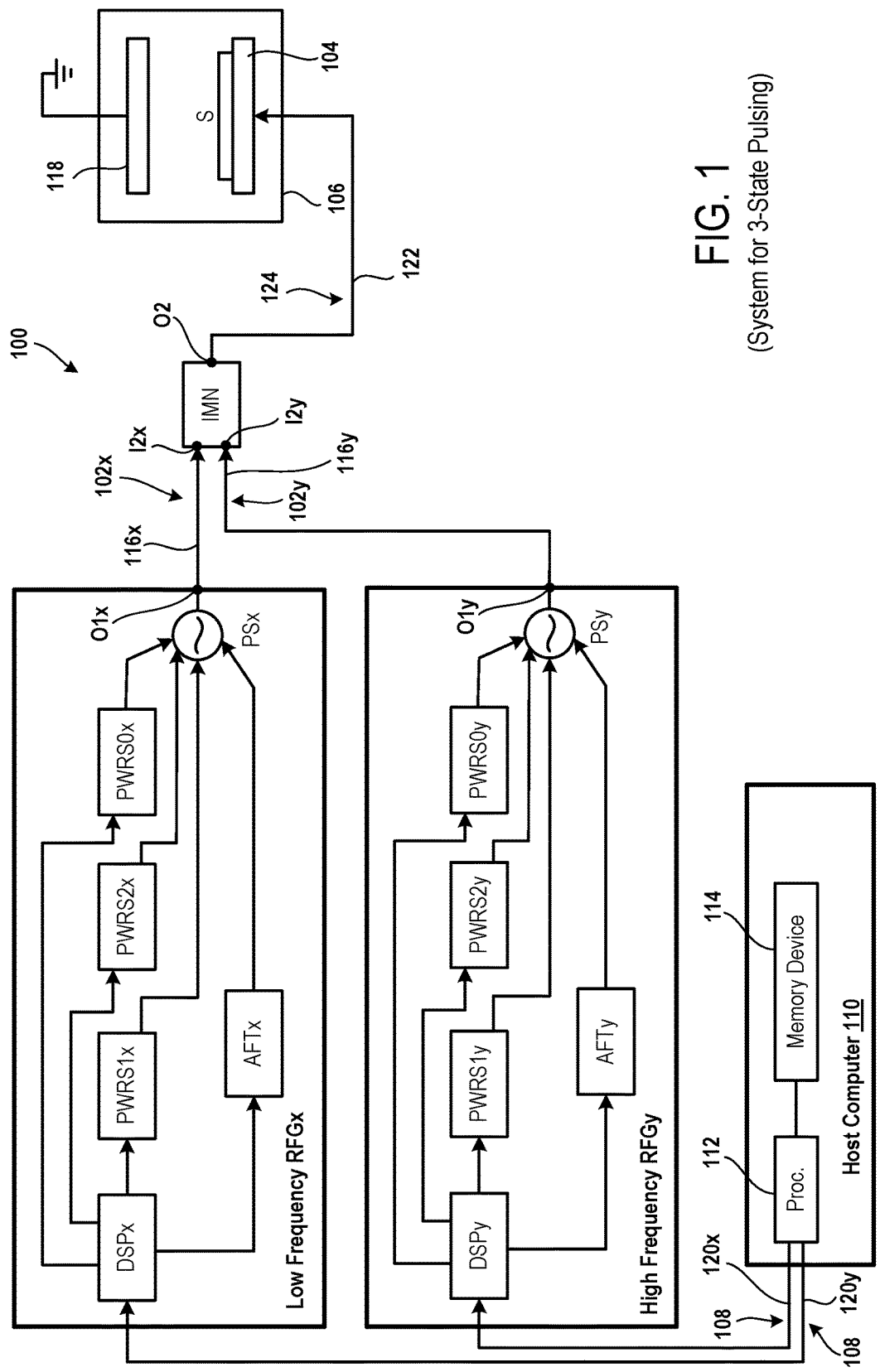
FIG. 1 is a diagram of an embodiment of a system to illustrate three-state pulsing of multiple radiofrequency (RF) signals to achieve a balance between bow control and mask selectivity.

FIG. 1 is a diagram of an embodiment of a system 100 to illustrate three-state pulsing of multiple radiofrequency (RF) signals to achieve the balance between bow control and mask selectivity. The system 100 includes an RF generator RFGx, another RF generator RFGy, an impedance matching network IMN, a plasma chamber 106, and a host computer 110.

An example of the RF generator RFGx is a low frequency RF generator, such as an RF generator having an operating frequency of 400 kilohertz (kHz) or 2 megahertz (MHz), or 13.56 MHz. An example of the RF generator RFGy is a high frequency RF generator, such as an RF generator having an operating frequency of 27 MHz or 60 MHz. It should be noted that the operating frequency of the high frequency RF generator is greater than the operating frequency of the low frequency RF generator.

The impedance matching network IMN is a network of circuit components, such as inductors, capacitors, and resistors. For example, the impedance matching network is a circuit that includes a shunt capacitor and a series capacitor. The shunt capacitor is coupled to the series capacitor at one end of the shunt capacitor and an opposite end of the shunt capacitor is coupled to a ground potential. The series capacitor is coupled between an input, such as an input I2x or an input I2y, of the impedance matching network IMN and an output O2 of the impedance matching network IMN. As another example, one or more circuit components of the impedance matching network IMN are coupled in series or in parallel to one or more circuit components of the impedance matching network IMN. The impedance matching network IMN has a branch including one or more circuit components and the branch is coupled between the input I2x and the output O2. Similarly, the impedance matching network IMN has another branch including one or more circuit components and the branch is coupled between the input I2y and the output O2.

The plasma chamber 106 includes a substrate support 104, such as a chuck. The chuck includes a lower electrode embedded within the chuck, a facility plate located below the lower electrode, and a ceramic plate located over the lower electrode. The plasma chamber 106 further includes an upper electrode 118, which is coupled to the ground potential. Examples of the host computer 110 include a desktop computer, a laptop computer, a controller, a tablet, and a smartphone.

The RF generator RFGx includes a digital signal processor (DSP) DSPx, a power controller PWRS1x, another power controller PWRS2x, yet another power controller PWRS0x, an auto frequency tuner (AFT) AFTx, and a power supply PSx. Examples of a DSP, as used herein, include a controller that includes a microprocessor, an application specific integrated circuit (ASIC), or a programmable logic device (PLD). The controller of the DSP also includes a memory device that is able to fetch multiple data or instructions at the same time. The memory device of the DSP is coupled to the microprocessor, the ASIC, or the PLD of the DSP. Examples of a memory device, as used herein, include a read-only memory (ROM), a random access memory (RAM), a flash memory, a storage disk array, a hard disk, etc.

An example of a power controller, as used herein, includes a microcontroller. To illustrate, the power controller includes a microprocessor, an ASIC, or a PLD. The power controller further includes a memory device that is coupled to the microprocessor, the ASIC, or the PLD of the power controller.

An example of a tuner, as used herein, includes a microcontroller. To illustrate, the tuner includes a microprocessor, an ASIC, or a PLD. The tuner further includes a memory device that is coupled to the microprocessor, the ASIC, or the PLD of the tuner.

An example of a power supply, as used herein, includes an electronic oscillator or an RF oscillator that produces a periodic, oscillating electronic signal, such as a sine wave RF signal.

The digital signal processor DSPx is coupled to the power controllers PWRS1x, PWRS2x, and PWRS0x, and to the auto frequency tuner AFTx. Moreover, each of the power controllers PWRS1x, PWRS2x, and PWRS0x is coupled to the power supply PSx. Also, the auto frequency tuner AFTSx is coupled to the power supply PSx.

The RF generator RFGy includes a digital signal processor DSPy, a power controller PWRS1y, another power controller PWRS2y, yet another power controller PWRS0y, an auto frequency tuner AFTy, and a power supply PSy. The digital signal processor DSPy is coupled to the power controllers PWRS1y, PWRS2y, and PWRS0y, and to the auto frequency tuner AFTy. Moreover, each of the power controllers PWRS1y, PWRS2y, and PWRS0y is coupled to the power supply PSy. Also, the auto frequency tuner AFTSy is coupled to the power supply PSy.

The host computer includes a processor 112 and a memory device 114. The processor 112 is coupled to the memory device 114. Examples of a processor, as used herein, include a microprocessor, an ASIC, a central processing unit (CPU), or a PLD.

The processor 112 is coupled via a transfer cable 120x to the digital signal processor DSPx and is coupled via another transfer cable 120y to the digital signal processor DSPy. Examples of a transfer cable, as used herein, include a parallel transfer cable for facilitating a parallel transfer of data between the processor 112 and a DSP, a serial transfer cable for facilitating a transfer of data in series between the processor 112 and the DSP, and a universal serial bus (USB) transfer cable that facilitates a transfer of data between the processor 112 and the DSP by applying an USB standard.

The power supply PSx is coupled via an RF cable 102x to the input I2x of the impedance matching network IMN. For example, an output O1x of the RF generator RFG x is coupled via the RF cable 120x to the input I2x. Moreover, the power supply PSy is coupled via an RF cable 102y to the input I2y of the impedance matching network IMN. For example, an output O1y of the RF generator RFGy is coupled via the RF cable 120y to the input I2y.

The output O2 of the impedance matching network IMN is coupled via an RF transmission line 122 to the lower electrode of the substrate support 104. An example of the RF transmission line 122 includes a conductor that is surrounded by an insulator that is surrounded by an RF sleeve, such as an aluminum solid bar. The insulator can be a dielectric material, such as Teflon™. Another example of the RF transmission line 122 includes the conductor that is coupled via one or more RF straps to an RF cylinder having an inner conductive rod and an outer housing. The inner conductive rod of the RF cylinder is coupled to the lower electrode. As described in the preceding example, the conductor is surrounded by the insulator that is surrounded by the RF sleeve. The conductor of the RF transmission line 122 is coupled to the output O2 of the impedance matching network IMN.

The processor 112 generates a clock signal and a digital pulsed signal 108 in synchronization with the clock signal. Examples of the clock signal and the digital pulsed signal 108 are provided below. The digital pulsed signal 108 has three states, such as a state S1, a state S2, and a state S0, which are illustrated below.

The processor 112 accesses, such as reads or obtains, from the memory device 114, a power level for the state S1 of an RF signal 102x to be generated by the RF generator RFGx, a power level for the state S2 of the RF signal 102x, and a power level for the state S0 of the RF signal 102x. Moreover, the processor 112 accesses from the memory device 114 a power level for the state S1 of an RF signal 102y to be generated by the RF generator RFGy, a power level for the state S2 of the RF signal 102y, a power level for the state S0 of the RF signal 102y. Each RF signal 102x and 102y is a sinusoidal signal.

It should be noted that in one embodiment, a power level of an RF signal for a state is a power level that is achieved by the RF signal during the state. For example, a power level for a state S1 of the RF signal is the power level that is achieved during an instance of the state S1 of the digital pulsed signal 108, a power level for a state S2 of the RF signal is the power level that is achieved during an instance of the state S2 of the digital pulsed signal 108, and a power level for a state S0 of the RF signal is the power level that is achieved during an instance of the state S0 of the digital pulsed signal 108.

The processor 112 sends the power levels for the states S1, S2, and S0 of the RF signal 102x to be generated, via the transfer cable 120x to the digital signal processor DSPx within an identity of each of the states S1, S2, and S0. Upon receiving the power levels for the states S1, S2, and S0 of the RF signal 102x with the identities of the states S1, S2, and S0, the digital signal processor DSPx accesses from a memory device of the digital signal processor DSPx a correspondence, such as a one-to-one mapping or a link or a one-to-one relationship, between the identities of the states S1 through S0 and the power controllers PWRS1x, PWRS2x, and PWRS0x, and sends the power level for the state S1 to the power controller PWRS1x, sends the power level for the state S2 to the power controller PWRS2x, and sends the power level for the state S0 to the power controller PWRS0x. Each power controller PWRS1x, PWRS2x, and PWRS0x stores a respective power level received from the digital signal processor DSPx in a memory device of the power controller.

Similarly, the processor 112 sends the power levels for the states S1, S2, and S0 of the RF signal 102y to be generated via the transfer cable 120y to the digital signal processor DSPy within the identity of each of the states S1, S2, and S0. Upon receiving the power levels for the states S1, S2, and S0 of the RF signal 102y with the identities of the states S1, S2, and S0, the digital signal processor DSPy accesses from a memory device of the digital signal processor DSPy a correspondence, such as a one-to-one mapping or a link or a one-to-one relationship, between the identities of the states S1, S2, and S0 and the power controllers PWRS1y, PWRS2y, and PWRS0y, and sends the power level for the state S1 to the power controller PWRS1y, sends the power level for the state S2 to the power controller PWRS2y, and sends the power level for the state S0 to the power controller PWRS0y. Each power controller PWRS1y, PWRS2y, and PWRS0y stores a respective power level received from the digital signal processor DSPy in a memory device of the power controller.

The processor 112 sends the digital pulsed signal 108 via the transfer cable 120x to the digital signal processor DSPx and simultaneously sends the digital pulsed signal 108 via the transfer cable 120y to the digital signal processor DSPy. In response to receiving the digital pulsed signal 108, the digital signal processor DSPx identifies a state of the digital pulsed signal 108 from a logic level of the digital pulsed signal 108. For example, the digital signal processor DSPx identifies a state of the digital pulsed signal 108 to be S1 upon determining that the logic level of the digital pulsed signal 108 is zero, identifies a state of the digital pulsed signal 108 to be S2 upon determining that the logic level of the digital pulsed signal 108 is one, and identifies a state of the digital pulsed signal 108 to be S0 upon determining that the logic level of the digital pulsed signal 108 is two.

During the state S1 of the digital pulsed signal 108, upon identifying the state of the digital pulsed signal 108 to be S1, the digital signal processor DSPx sends a control signal to the power controller PWRS1x. In response to receiving the control signal during the state S1 of the digital pulsed signal 108, the power controller PWRS1x accesses the power level for the state S1 from the memory device of the power controller PWRS1x, generates a signal including the power level for the state S1, and sends the signal to the power supply PSx. During the state S1 of the digital pulsed signal 108, in response to receiving the signal including the power level for the state S1 from the power controller PWRS1x, the power supply PSx generates a portion of the RF signal 102x having the power level for the state S1.

Similarly, during the state S2 of the digital pulsed signal 108, upon identifying the state of the digital pulsed signal 108 to be S2, the digital signal processor DSPx sends a control signal to the power controller PWRS2x. Upon receiving the control signal during the state S2 of the digital pulsed signal 108, the power controller PWRS2x accesses the power level for the state S2 from the memory device of the power controller PWRS2x, generates a signal including the power level for the state S2, and sends the signal to the power supply PSx. During the state S2 of the digital pulsed signal 108, in response to receiving the signal having the power level for the state S2 from the power controller PWRS1x, the power supply PSx transitions the RF signal 102x from the power level for the state S1 to the power level for the state S2 to generate a portion of the RF signal 102x having the power level for the state S2.

Also, during the state S0 of the digital pulsed signal 108, upon identifying the state of the digital pulsed signal 108 to be S0, the digital signal processor DSPx sends a control signal to the power controller PWRS0x. Upon receiving the control signal during the state S0 of the digital pulsed signal 108, the power controller PWRS0x accesses the power level for the state S0 from the memory device of the power controller PWRS0x, generates a signal including the power level for the state S0, and sends the signal to the power supply PSx. During the state S0 of the digital pulsed signal 108, in response to receiving the signal having the power level for the state S0 from the power controller PWRS0x, the power supply PSx transitions the RF signal 102x from the power level for the state S2 to the power level for the state S0 to generate a portion of the RF signal 102x having the power level for the state S0.

In a similar manner, in response to receiving the digital pulsed signal 108, the digital signal processor DSPy identifies a state of the digital pulsed signal 108 from a logic level of the digital pulsed signal 108 in the same manner, described above, in which the digital signal processor DSPx identifies the state of the digital pulsed signal 108. For example, the digital signal processor DSPy identifies a state of the digital pulsed signal 108 to be S1 upon determining that the logic level of the digital pulsed signal 108 is zero, identifies a state of the digital pulsed signal 108 to be S2 upon determining that the logic level of the digital pulsed signal 108 is one, and identifies a state of the digital pulsed signal 108 to be S0 upon determining that the logic level of the digital pulsed signal 108 is two.

During the state S1 of the digital pulsed signal 108, upon identifying the state of the digital pulsed signal 108 to be S1, the digital signal processor DSPy sends a control signal to the power controller PWRS1y. Also, upon receiving the control signal during the state S1 of the digital pulsed signal 108, the power controller PWRS1y accesses the power level for the state S1 from the memory device of the power controller PWRS1y, generates a signal including the power level for the state S1, and sends the signal to the power supply PSy. During the state S1 of the digital pulsed signal 108, in response to receiving the signal having the power level for the state S1 from the power controller PWRS1y, the power supply PSy generates a portion of the RF signal 102y having the power level for the state S1.

Similarly, during the state S1 of the digital pulsed signal 108, upon identifying the state of the digital pulsed signal 108 to be S2, the digital signal processor DSPy sends a control signal to the power controller PWRS2x. Upon receiving the control signal during the state S2 of the digital pulsed signal 108, the power controller PWRS2y accesses the power level for the state S2 from the memory device of the power controller PWRS2y, and generates a signal including the power level for the state S2, and sends the signal to the power supply PSy. During the state S2 of the digital pulsed signal 108, in response to receiving the signal having the power level for the state S2 from the power controller PWRS1y, the power supply PSy transitions the RF signal 102y from the power level for the state S1 to the power level for the state S2 to generate a portion of the RF signal 102y having the power level for the state S2.

Also, during the state S0 of the digital pulsed signal 108, upon identifying the state of the digital pulsed signal 108 to be S0, the digital signal processor DSPy sends a control signal to the power controller PWRS0y. In response to receiving the control signal during the state S0 of the digital pulsed signal 108, the power controller PWRS0y accesses the power level for the state S0 from the memory device of the power controller PWRS0y, generates a signal including the power level for the state S0, and sends the signal to the power supply PSy. During the state S0 of the digital pulsed signal 108, in response to receiving the signal having the power level for the state S0 from the power controller PWRS0y, the power supply PSy transitions the RF signal 102y from the power level for the state S2 to the power level for the state S0 to generate a portion of the RF signal 102y having the power level for the state S0.

The RF signal 102x is supplied by the power supply PSx via the output O1x and the RF cable 116x to the input I2x of the impedance matching network IMN. Also, the RF signal 102y is supplied by the power supply PSy via the output O1y and the RF cable 116y to the input I2y of the impedance matching network IMN. The impedance matching network IMN receives the RF signal 102x at the input I2x, and as the RF signal 102x is transferred via the branch circuit of the impedance matching network IMN that is coupled to the input I2x, an impedance of the RF signal RF 102x is modified by the branch circuit to output a first modified RF signal. Similarly, the impedance matching network IMN receives the RF signal 102x at the input I2y and as the RF signal 102y is transferred via the branch circuit of the impedance matching network IMN that is coupled to the input I2y, an impedance of the RF signal RF 102y is modified by the branch circuit to output a second modified RF signal. The impedances of the RF signals 102x and 102y are modified to match an impedance of a load coupled to the output O2 with an impedance of a source coupled to the inputs I2x and I2y. An example of the load coupled to the output O2 includes the RF transmission line 122 and the plasma chamber 106. An example of the source coupled to the inputs I2x and I2y include the RF cables 116x and 116y and the RF generators RFGx and RFGy. The branch circuit coupled to the input I2x is connected at the output O2 to the branch circuit coupled to the input I2y to combine the first and second modified RF signals to output a combined modified RF signal 124 at the output O2.

The combined modified RF signal 124 is sent via the RF transmission line 122 from the output O2 of the impedance matching network IMN to the lower electrode of the substrate support 104. In addition, one or more process gases, such as a fluorine containing gas, or an oxygen containing gas, or a combination thereof, are supplied to a gap between the upper electrode 118 and the substrate support 104 within the plasma chamber 106. When the combined modified RF signal 124 and the one or more process gases are simultaneously supplied to the plasma chamber 106, plasma is stricken or maintained within the gap to process a substrate S. Examples of the substrate S include a semiconductor wafer that is formed on a substrate layer, and a substrate stack that is formed on a substrate layer. Examples of processing the substrate S include depositing one or more materials, such as an oxide layer, a nitride layer, a silicon nitride layer, a mask layer, or a combination of two or more thereof, on a substrate layer. Other examples of processing the substrate include etching the substrate S or sputtering the substrate S or cleaning the substrate S.

In one embodiment, the lower electrode of the substrate support 104 is coupled to the ground potential and the upper electrode 118 is coupled to the output O2 of the impedance matching network IMN.

In an embodiment, one or more RF generators are coupled via an impedance matching network to the upper electrode 118 in addition to the RF generators RFGx and RFGy being coupled via the impedance matching network IMN to the lower electrode of the substrate support 104.

In one embodiment, the functions or operations described herein as being performed by one or more of the digital signal processor DSPx, the power controller PWRS1x, the power controller PWRS2x, the power controller PWRS0x, and the auto frequency tuner AFTSx are performed by a controller or a processor of the RF generator RFGx. For example, functions described herein as being performed by the power controller PWRS1x, the power controller PWRS2x, the power controller PWRS0x, and the auto frequency tuner AFTx are performed by the digital signal processor DSPx.

Similarly, in an embodiment, functions or operations described herein as being performed by one or more of the digital signal processor DSPy, the power controller PWRS1x, the power controller PWRS2y, the power controller PWRS0y, and the auto frequency tuner AFTSy are performed by a controller or a processor of the RF generator RFGy. For example, functions described herein as being performed by the power controller PWRS1y, the power controller PWRS2y, the power controller PWRS0y, and the auto frequency tuner AFTy are performed by the digital signal processor DSPy.

In an embodiment, functions or operations described herein as being performed by one or more of the digital signal processor DSPx, the power controller PWRS1x, the power controller PWRS2x, the power controller PWRS0x, the auto frequency tuner AFTSx, the digital signal processor DSPy, the power controller PWRS1y, the power controller PWRS2y, the power controller PWRS0y, and the auto frequency tuner AFTSy are performed by the processor 112.

In one embodiment, the clock signal is generated by a clock source instead of the processor 112.

FIG. 2A is an embodiment of a graph 202 of a clock signal 204, which is the clock signal described above. The clock signal 204 is generated by the processor 112. The graph 202 plots a logic level on a y-axis and a time t on an x-axis. The y-axis of the graph 202 includes a logic level 0 and a logic level 1. The x-axis of the graph 202 includes multiple times t0, t1, t2, t3, t4, and t5.

A time interval between any two consecutive times on the x-axis of the graph 202 is the same. For example, a time interval between the times t0 and t1 is equal to a time interval between the times t1 and t2, and the time interval between the times t1 and t2 is equal to a time interval between the times t2 and t3. The time interval between times t3 and t4 is equal to a time interval between the times t2 and t3, and the time interval between times t4 and t5 is equal to a time interval between the times t3 and t4. The time t1 is consecutive to the time t0. Similarly, the time t2 is consecutive to the time t1, the time t3 is consecutive to the time t2, the time t4 is consecutive to the time t3, and the time t5 is consecutive to the time t4.

The clock signal 204 periodically transitions between the logic levels 0 and 1. For example, during a first half of a cycle 1 of the clock signal 204, the clock signal 204 is at the logic level 1. At the time t1, the clock signal 204 transitions from the logic level 1 to the logic level 0. During a second half of the cycle 1 of the clock signal 204, the clock signal 204 has the logic level 0. At the time t2, the clock signal 204 transitions from the logic level 0 to the logic level 1. During a first half of a cycle 2 of the clock signal 204, the clock signal 204 is at the logic level 1. At the time t3, the clock signal 204 transitions from the logic level 1 to the logic level 0. During a second half of the cycle 2 of the clock signal 204, the clock signal is that the logic level 0. At the time t4, the clock signal 204 transitions from the logic level 0 to the logic level 1.

The cycle 2 of the clock signal 204 is consecutive to the cycle 1 of the clock signal 204. For example, there are no other clock cycles between the cycles 1 and 2 of the clock signal 204. The cycle 1 occurs from the time t0 to the time t2 and the cycle 2 occurs from the time t2 to the time t4.

FIG. 2B is a diagram of an embodiment of a graph 206 to illustrate an embodiment of a digital pulsed signal 208. The digital pulsed signal 208 is an example of the digital pulsed signal 108 of FIG. 1. The graph 206 plots a logic level of the digital pulsed signal 208 on a y-axis and the time t on an x-axis. The y-axis of the graph 206 includes the logic levels 0, 1, and 2. The x-axis of the graph 206 includes the time t0, a time t0a, a time t0b, the time t1, the time t2, a time t2a, a time t2b, and the times t3 and t4. The time t0a occurs between the times t0 and t0b, and the time t0b occurs between the times t0a and t1. Moreover, the time t2a occurs between the times t2 and t2b and the time t2b occurs between the times t2a and t3.

The digital pulsed signal 208 periodically transitions among its states S1, S2, and S0. For example, the digital pulsed signal 208 has the state S1, which is defined by the logic level 0, from the time t0 to the time t0a. To illustrate, during the state S1 of the digital pulsed signal 208, the digital pulsed signal 208 is at the logic level 0. The digital pulsed signal 208 transitions from the logic level 0 to the logic level 1 at the time t0a. The state S2 of the digital pulsed signal 208 is defined by the logic level 1. To illustrate, during the state S2 of the digital pulsed signal 208, the digital pulsed signal 208 is at the logic level 1.

The digital pulsed signal 208 has the state S2 from the time t0a to the time t0b. At the time t0b, the digital pulsed signal 208 transitions from the state S2 to the state S0, which is defined by the logic level 2. To illustrate, during the state S0 of the digital pulsed signal 208, the digital pulsed signal 208 is at the logic level 2. The digital pulsed signal 208 has the state S0 from the time t0b to the time t2. At the time t2, the digital pulsed signal 208 transitions from the state S0 back to the state S1.

The digital pulsed signal 208 has the state S1 from the time t2 to the time t2a. The digital pulsed signal 208 transitions from the state S1 to the state S2 at the time t2a. The digital pulsed signal 208 has the state S2 from the time t2a to the time t2b. At the time t2b, the digital pulsed signal 208 transitions from the state S2 to the state S0. The digital pulsed signal 208 has the state S0 from the time t2b to the time t4. At the time t4, the digital pulsed signal 208 transitions from the state S0 back to the state S1.

It should be noted that multiple instances of each of the states S1, S2, and S0 of the digital pulsed signal 208 occur. For example, a first instance of the state S1 of the digital pulsed signal 208 occurs between the times t0 and t0a, and a second instance of the state S1 of the digital pulsed signal 208 occurs between the times t2 and t2a. As another example, a first instance of the state S2 of the digital pulsed signal 208 occurs between the times t0a and t0b, and a second instance of the state S2 of the digital pulsed signal 208 occurs between the times t2a and t2b. As yet another example, a first instance of the state S0 of the digital pulsed signal 208 occurs between the times t0b and t2, and a second instance of the state S0 of the digital pulsed signal 208 occurs between the times t2a and t4. As another example, the first instance of the state S2 of the digital pulsed signal 208 is consecutive to the first instance of the state S1 of the digital pulsed signal 208 and the first instance of the state S0 of the digital pulsed signal 208 is consecutive to the first instance of the state S2 of the digital pulsed signal 208. The second instance of the state S1 of the digital pulsed signal 208 is consecutive to the first instance of the state S0 of the digital pulsed signal 208. Also, the second instance of the state S2 of the digital pulsed signal 208 is consecutive to the second instance of the state S1 of the digital pulsed signal 208 and the second instance of the state S0 of the digital pulsed signal 208 is consecutive to the second instance of the state S2 of the digital pulsed signal 208.

FIG. 2C is an embodiment of a graph 210 to illustrate an embodiment of an RF signal 212 generated by the RF generator RFGx (FIG. 1) and an embodiment of an RF signal 214 generated by the RF generator RFGy (FIG. 1). The RF signal 212 is an example of the RF signal 102x (FIG. 1), and the RF signal 214 is an example of the RF signal 102y (FIG. 1).

The RF signals 212 and 214 are synchronized to the digital pulsed signal 208. For example, each of the RF signals 212 and 214 initiate a transition from the state S1 to the state S2 at the time t0a of transition of the digital pulsed signal 208 from the state S1 the state S2. As another example, each of the RF signals 212 and 214 initiate a transition from the state S2 to the state S0 at the time t0b of transition of the digital pulsed signal 208 from the state S2 the state S0. As yet another example, each of the RF signals 212 and 214 initiate a transition from the state S0 to the state S1 at the time t2 of transition of the digital pulsed signal 208 from the state S0 the state S1.

The graph 210 plots power levels of the RF signals 212 and 214. For example, the y-axis of the graph 210 includes power levels P0, P1, P2, P3, and P4. The power level P1 is greater than the power level P0. Also, the power level P2 is greater than the power level P1 and the power level P3 is greater than the power level P2. The power level P4 is greater than the power level P3.

A power level, as used herein, is an envelope, such as a peak-to-peak amplitude, of an RF signal. For example, the power levels P4, P2, and P0 are envelopes of the RF signal 102x and the power levels P1, P3, and P0 are envelopes of the RF signal 102y. As another example, a power level includes one or more peak-to-peak power values that are within a predetermined range from the power level, such as greater than or less than a value of the power level. As yet another example, the power level is a statistical value, such as an average or a median, of all the peak-to-peak power values of the power level. As another example, the power level is a highest of all peak-to-peak power values of the power level. As yet another example, the power level is a lowest of all peak-to-peak power values of the power level.

Also, a first power level is different from a second power level. For example, one or more power values of the power level P0 are exclusive of one or more power values of the power level P1 and one or more power values of the power level P2 are exclusive of the one or more power values of each of the power levels P0 and P1.

Also, the graph 210 plots the time t on an x-axis. For example, the x-axis of the graph 210 includes the times t0, t0a, t0b, t1, t2, t2a, t2b, t3, and t4.

The RF signal 212 periodically transitions among the states S1, S2, and S0 of the RF signal 212 in a manner described below. Similarly, the RF signal 214 periodically transitions among the states S1, S2, and S0 of the RF signal 214 in a manner described below The state S1 of the RF signal 212 is defined by the power level P4. For example, during the state S1 of the digital pulsed signal 208 or the RF signal 212, the RF signal 212 has the power level P4.

The RF signal 212 transitions from the state S1 to the state S2 within a time window from the time t0a. The state S2 of the RF signal 212 is defined by the power level P2. For example, during the state S2 of the digital pulsed signal 208 or the RF signal 212, the RF signal 212 has the power level P2.

It should be noted that an RF signal, described herein, does not transition from one state to a consecutive state instantaneously. For example, a transition of the RF signal 212 from the state S1 to the state S2 is not instantaneous. To illustrate, the transition of the RF signal 212 from the state S1 to the state S2 occurs within the time window. As another example, a time window of transition from a time, as used herein, is a time period that occurs during a state after the time. To illustrate, the time window from the time t0a is a time period that occurs during the state S2 of the digital pulsed signal 208 after the time t0a. The time period after the time t0a occurs during the state S2 of the digital pulsed signal 208 from the time t0a to a time between the times t0a and t0b.

The RF signal 212 transitions from the state S2 to the state S0 within a time window from the time t0b. The state S0 of the RF signal 212 is defined by the power level P0. For example, during the state S0 of the digital pulsed signal 208 or the RF signal 212, the RF signal 212 has the power level P0.

The RF signal 212 transitions from the state S0 to the state S1 within a time window from the time t2. The RF signal 212 transitions from the state S1 to the state S2 within a time window from the time t2a and transitions from the state S2 to the state S0 within a time window from the time t2b.

Similarly, during the state S1 of the digital pulsed signal 208, the RF signal 214 has the power level P1. The state S1 of the RF signal 214 is defined by the power level P1. For example, during the state S1 of the digital pulsed signal 208 or the RF signal 214, the RF signal 214 has the power level P1.

The RF signal 214 transitions from the state S1 to the state S2 within a time window from the time t0a. The state S2 of the RF signal 214 is defined by the power level P3. For example, during the state S2 of the digital pulsed signal 208 or the RF signal 214, the RF signal 214 has the power level P3.

The RF signal 214 transitions from the state S2 to the state S0 within a time window from the time t0b. The state S0 of the RF signal 214 is defined by the power level P0. For example, during the state S0 of the digital pulsed signal 208 or the RF signal 214, the RF signal 214 has the power level P0.

The RF signal 214 transitions from the state S0 to the state S1 within a time window from the time t2. The RF signal 214 transitions from the state S1 to the state S2 within a time window from the time t2a and transitions from the state S2 to the state S0 within a time window from the time t2b.

The state S1 of the RF signal 212 between the times t0 and t0a is a first instance of the state S1 of the RF signal 212 and the state S1 of the RF signal 212 between the times t2 and t2a is a second instance of the state S1 of the RF signal 212. Similarly, the state S2 of the RF signal 212 between the times t0a and t0b is a first instance of the state S2 of the RF signal 212 and the state S2 of the RF signal 212 between the times t2a and t2b is a second instance of the state S2 of the RF signal 212. Also, the state S0 of the RF signal 212 between the times t0b and t2 is a first instance of the state S0 of the RF signal 212 and the state S0 of the RF signal 212 between the times t2b and t4 is a second instance of the state S0 of the RF signal 212.

Similarly, the state S1 of the RF signal 214 between the times t0 and t0a is a first instance of the state S1 of the RF signal 214 and the state S1 of the RF signal 214 between the times t2 and t2a is a second instance of the state S1 of the RF signal 214. Similarly, the state S2 of the RF signal 214 between the times t0a and t0b is a first instance of the state S2 of the RF signal 214 and the state S2 of the RF signal 214 between the times t2a and t2b is a second instance of the state S2 of the RF signal 214. Also, the state S0 of the RF signal 214 between the times t0b and t2 is a first instance of the state S0 of the RF signal 214 and the state S0 of the RF signal 214 between the times t2b and t4 is a second instance of the state S0 of the RF signal 214.

Figure 2D:
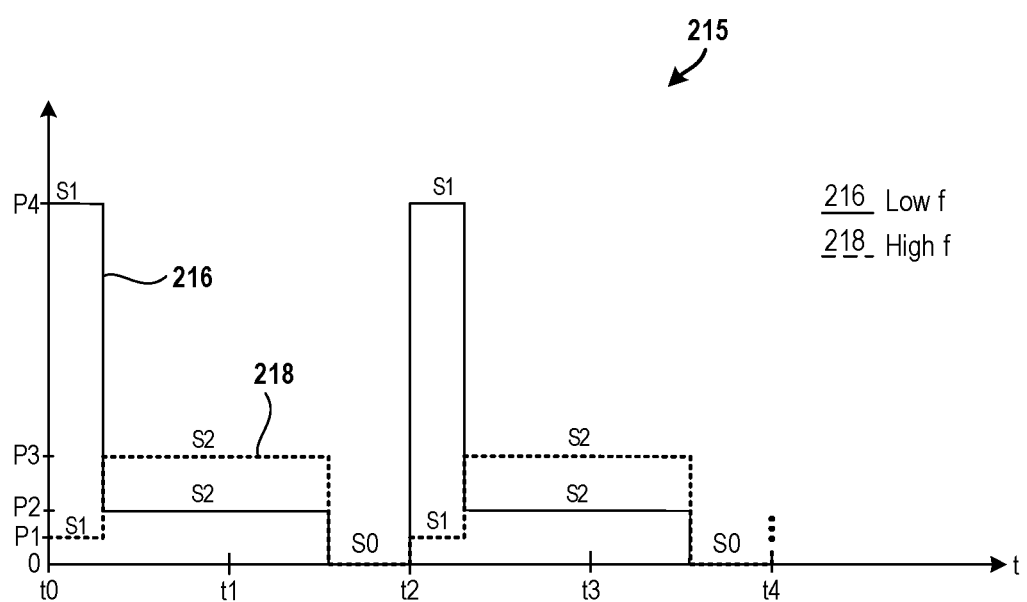
FIG. 2D is an embodiment of a graph to illustrate an embodiment of an RF signal generated by the low frequency RF generator and an embodiment of an RF signal generated by the high frequency RF generator.

FIG. 2D is an embodiment of a graph 215 to illustrate an embodiment of an RF signal 216 generated by the RF generator RFGx (FIG. 1) and an embodiment of an RF signal 218 generated by the RF generator RFGy (FIG. 1). The RF signal 216 is an example of the RF signal 102x (FIG. 1), and the RF signal 218 is an example of the RF signal 102y (FIG. 1).

The graph 215 plots power levels of the RF signals 216 and 218. Also, the graph 215 plots the time t on an x-axis. For example, the x-axis of the graph 215 includes the times t0, t2, t2, t3, and t4. It should be noted that duty cycles of the states S1 through S3 of the RF signals 216 and 218 are different than the duty cycles of the states S1 through S3 illustrated in FIG. 2C. For example, the duty cycle of the state S1 of the RF signals 216 and 218 is 25%, the duty cycle of the state S2 of the RF signals 216 and 218 is 40%, and the duty cycle of the state S3 of the RF signals 216 and 218 is 35%.

Figure 3A:
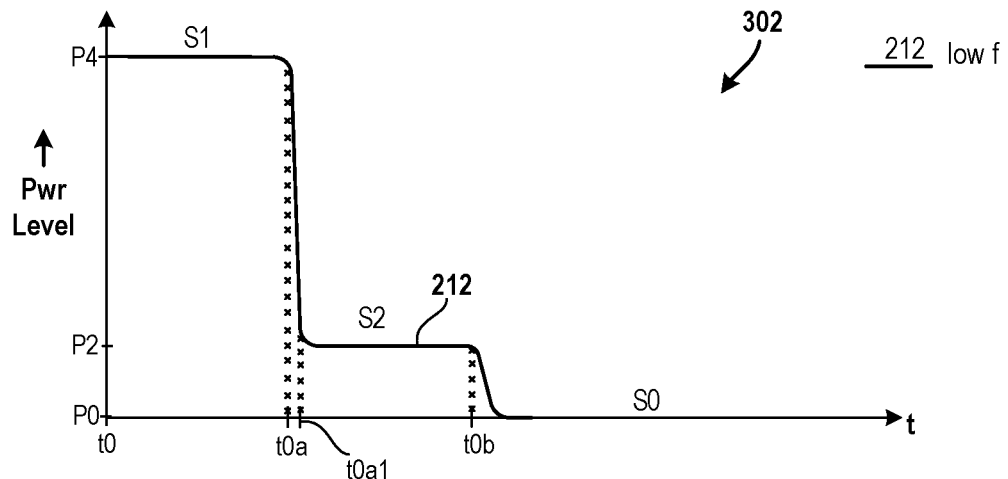
FIG. 3A is an embodiment of a graph to illustrate a zoom-in of a portion of the RF signal, of FIG. 2C, generated by the low frequency RF generator.

FIG. 3A is an embodiment of a graph 302 to illustrate a zoom-in of a portion of the RF signal 212. The graph 302 plots the power levels of the RF signal 212 versus the time t. The RF signal 212 transitions from the power level P4 to the power level P2 within a time window from the time t0a. For example, the RF signal 212 transitions from the power level P4 to the power level P2 during a time period between the time t0a and a time t0a1. The time t0a1 occurs during the state S2 of the RF signal 212 or of the digital pulsed signal 208 (FIG. 2B), and occurs between the times t0a and t0b. Similarly, the RF signal 212 transitions from the power level P2 to the power level P0 within a time window from the time t0b.

Figure 3B:
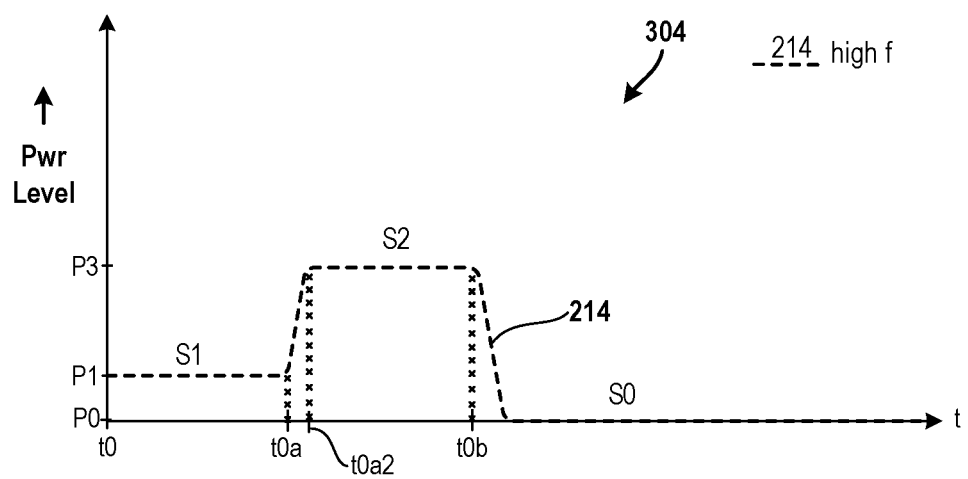
FIG. 3B is an embodiment of a graph to illustrate a zoom-in of a portion of the RF signal, of FIG. 2C, generated by the high frequency RF generator.

FIG. 3B is an embodiment of a graph 304 to illustrate a zoom-in of a portion of the RF signal 214. The graph 304 plots the power levels of the RF signal 214 versus the time t. The RF signal 214 transitions from the power level P1 to the power level P3 within a time window from the time t0a. For example, the RF signal 214 transitions from the power level P1 to the power level P3 during a time period between the time t0a and a time t0a2. The time t0a2 occurs during the state S2 of the RF signal 214 or of the digital pulsed signal 208 (FIG. 2B), and occurs between the times t0a and t0b. Similarly, the RF signal 214 transitions from the power level P3 to the power level P0 within a time window from the time t0b.

Figure 4A:
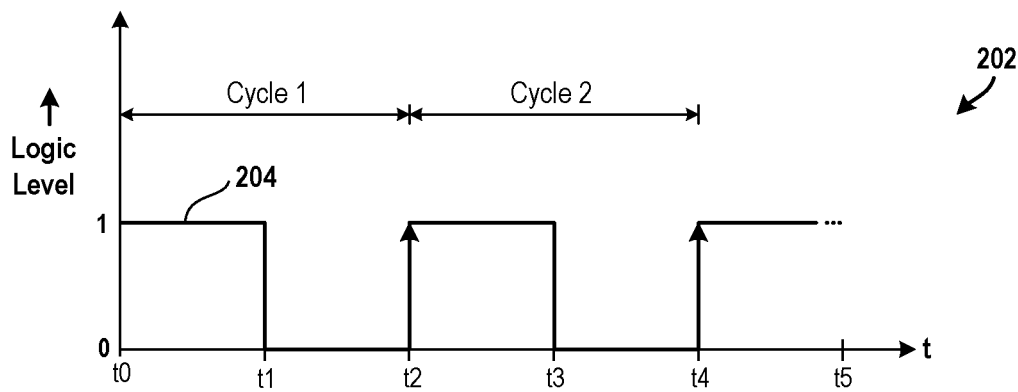
FIG. 4A is an embodiment of the graph of the clock signal of FIG. 2A.

FIG. 4A is a in an embodiment of the graph 202 of the clock signal 204.

Figure 4B:
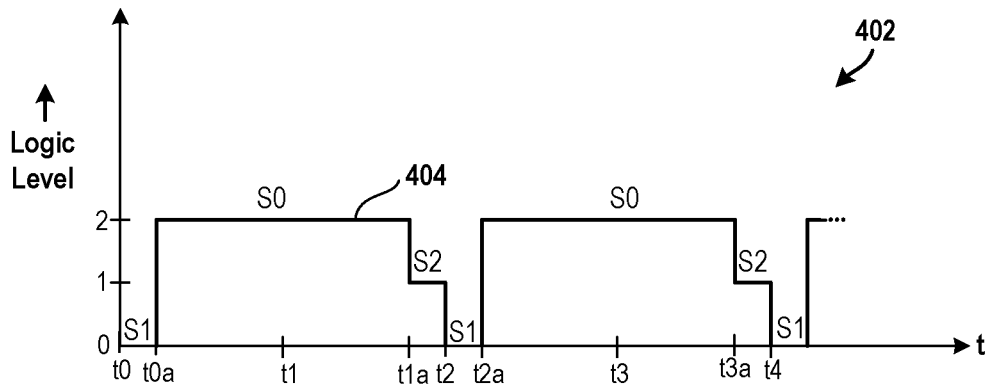
FIG. 4B is a diagram of an embodiment of a graph to illustrate an embodiment of a digital pulsed signal.

FIG. 4B is a diagram of an embodiment of a graph 402 to illustrate an embodiment of a digital pulsed signal 404. The digital pulsed signal 404 is an example of the digital pulsed signal 108 of FIG. 1. The graph 402 plots a logic level of the digital pulsed signal 404 on a y-axis and the time t on an x-axis. The y-axis of the graph 402 includes the logic levels 0, 1, and 2. The x-axis of the graph 402 includes the time t0, the time t0a, the time t1, a time t1a, the time t2, the time t2a, the time t3, a time t3a, and the time t4. The time t1a occurs between the times t1 and t2, and the time t3a occurs between the times t3 and t4.

The digital pulsed signal 404 periodically transitions among the states S1, S0, and S2. For example, the digital pulsed signal 404 has the state S1, which is defined by the logic level 0, from the time t0 to the time t0a. To illustrate, during the state S1, the digital pulsed signal 208 is at the logic level 0. The digital pulsed signal 404 transitions from the logic level 0 to the logic level 2 at the time t0a. The state S0 of the digital pulsed signal 404 is defined by the logic level 2. To illustrate, during the state S0, the digital pulsed signal 404 is at the logic level 2.

The digital pulsed signal 404 has the state S0 from the time t0a to the time t1a. At the time t1a, the digital pulsed signal 404 transitions from the state S0 to the state S2, which is defined by the logic level 1. To illustrate, during the state S2, the digital pulsed signal 404 is at the logic level 1.

At the time t2, the digital pulsed signal 404 transitions from the state S2 back to the state S1. The digital pulsed signal 404 has the state S1 from the time t2 to the time t2a. The digital pulsed signal 404 transitions from the state S1 to the state S0 at the time t2a. The digital pulsed signal 404 has the state S0 from the time t2a to the time t3a. At the time t3a, the digital pulsed signal 404 transitions from the state S0 to the state S2. The digital pulsed signal 404 has the state S2 from the time t3a to the time t4. At the time t4, the digital pulsed signal 404 transitions from the state S2 back to the state S1.

It should be noted that multiple instances of each of the states S1, S0, and S2 of the digital pulsed signal 404 occur. For example, a first instance of the state S1 of the digital pulsed signal 404 occurs between the times t0 and t0a, and a second instance of the state S1 of the digital pulsed signal 404 occurs between the times t2 and t2a. As another example, a first instance of the state S0 of the digital pulsed signal 404 occurs between the times t0a and t1a, and a second instance of the state S0 of the digital pulsed signal 404 occurs between the times t2a and t3a. As yet another example, a first instance of the state S2 of the digital pulsed signal 404 occurs between the times t1a and t2, and a second instance of the state S2 of the digital pulsed signal 404 occurs between the times t3a and t4. As another example, the first instance of the state S0 is consecutive to the first instance of the state S1 of the digital pulsed signal 404 and the first instance of the state S2 of the digital pulsed signal 404 is consecutive to the first instance of the state S0. The second instance of the state S1 of the digital pulsed signal 404 is consecutive to the first instance of the state S2 of the digital pulsed signal 404. Also, the second instance of the state S0 of the digital pulsed signal 404 is consecutive to the second instance of the state S1 of the digital pulsed signal 404 and the second instance of the state S2 of the digital pulsed signal 404 is consecutive to the second instance of the state S0 of the digital pulsed signal 404.

Figure 4C:
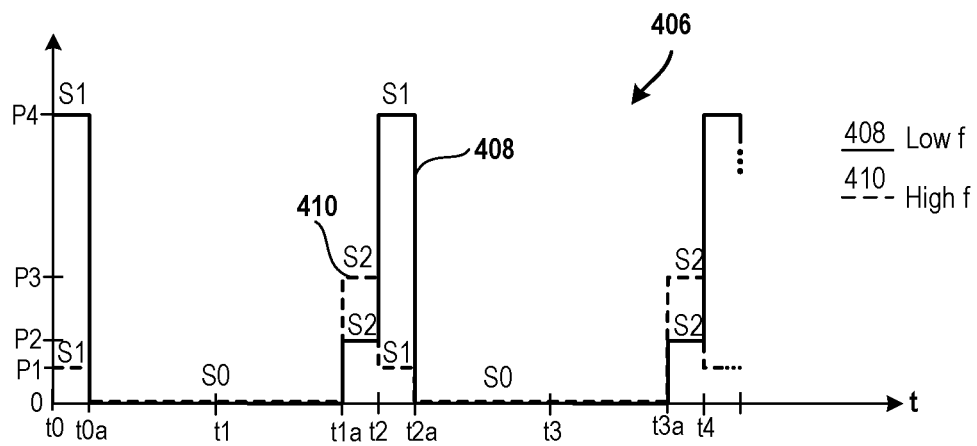
FIG. 4C is an embodiment of a graph to illustrate an embodiment of an RF signal generated by the low frequency RF generator and an embodiment of an RF signal generated by the high frequency RF generator.

FIG. 4C is an embodiment of a graph 406 to illustrate an embodiment of an RF signal 408 generated by the RF generator RFGx (FIG. 1) and an embodiment of an RF signal 410 generated by the RF generator RFGy (FIG. 1). The RF signal 408 is an example of the RF signal 102x (FIG. 1), and the RF signal 410 is an example of the RF signal 102y (FIG. 1).

The RF signals 408 and 410 are synchronized to the digital pulsed signal 404. For example, each of the RF signals 408 and 410 initiate a transition from the state S1 to the state S0 at a time of transition of the digital pulsed signal 404 from the state S1 the state S0. As another example, each of the RF signals 408 and 410 initiate a transition from the state S0 to the state S2 at a time of transition of the digital pulsed signal 404 from the state S0 the state S2. As yet another example, each of the RF signals 408 and 410 initiate a transition from the state S2 to the state S1 at a time of transition of the digital pulsed signal 404 from the state S2 the state S1.

The graph 406 plots power levels of the RF signals 408 and 410. For example, the y-axis of the graph 406 includes power levels P0, P1, P2, P3, and P4. Also, the graph 406 plots the time t on an x-axis. For example, the x-axis of the graph 406 includes the times t0, t0a, t1, t1a, t2, t2a, t3, t3a, and t4.

The RF signal 408 periodically transitions among the states S1, S0, and S2 of the RF signal 408 in a manner described below. Similarly, the RF signal 410 periodically transitions among the states S1, S0, and S2 of the RF signal 410 in a manner described below The state S1 of the RF signal 408 is defined by the power level P4. For example, during the state S1 of the digital pulsed signal 404 or the RF signal 408, the RF signal 408 has the power level P4.

The RF signal 408 transitions from the state S1 to the state S0 within a time window from the time t0a. The state S0 of the RF signal 408 is defined by the power level P0. For example, during the state S0 of the digital pulsed signal 404 or the RF signal 408, the RF signal 408 has the power level P0.

The RF signal 408 transitions from the state S0 to the state S2 within a time window from the time t1a. The state S2 of the RF signal 408 is defined by the power level P2. For example, during the state S2 of the digital pulsed signal 404 or the RF signal 408, the RF signal 408 has the power level P2.

The RF signal 408 transitions from the state S2 to the state S1 within a time window from the time t2. The RF signal 408 transitions from the state S1 to the state S0 within a time window from the time t2a and transitions from the state S0 to the state S2 within a time window from the time t3a.

Similarly, during the state S1 of the digital pulsed signal 404, the RF signal 410 has the power level P1. The state S1 of the RF signal 410 is defined by the power level P1. For example, during the state S1 of the digital pulsed signal 404 or the RF signal 410, the RF signal 410 has the power level P1.

The RF signal 410 transitions from the state S1 to the state S0 within a time window from the time t0a. The state S0 of the RF signal 410 is defined by the power level P0. For example, during the state S0 of the digital pulsed signal 404 or the RF signal 410, the RF signal 410 has the power level P0.

The RF signal 410 transitions from the state S0 to the state S2 within a time window from the time t1a. The state S2 of the RF signal 410 is defined by the power level P3. For example, during the state S2 of the digital pulsed signal 404 or the RF signal 410, the RF signal 410 has the power level P3.

The RF signal 410 transitions from the state S2 to the state S1 within a time window from the time t2. The RF signal 410 transitions from the state S1 to the state S0 within a time window from the time t2a and transitions from the state S0 to the state S2 within a time window from the time t3a.

The state S1 of the RF signal 408 between the times t0 and t0a is a first instance of the state S1 of the RF signal 408 and the state S1 of the RF signal 408 between the times t2 and t2a is a second instance of the state S1 of the RF signal 408. Similarly, the state S0 of the RF signal 408 between the times t0a and t1a is a first instance of the state S0 of the RF signal 408 and the state S0 of the RF signal 408 between the times t2a and t3a is a second instance of the state S0 of the RF signal 408. Also, the state S2 of the RF signal 408 between the times t1a and t2 is a first instance of the state S2 of the RF signal 408 and the state S2 of the RF signal 408 between the times t3a and t4 is a second instance of the state S2 of the RF signal 408.

Similarly, the state S1 of the RF signal 410 between the times t0 and t0a is a first instance of the state S1 of the RF signal 410 and the state S1 of the RF signal 410 between the times t2 and t2a is a second instance of the state S1 of the RF signal 410. Similarly, the state S0 of the RF signal 410 between the times t0a and t1a is a first instance of the state S0 of the RF signal 410 and the state S0 of the RF signal 410 between the times t2a and t3a is a second instance of the state S0 of the RF signal 410. Also, the state S2 of the RF signal 410 between the times t1a and t2 is a first instance of the state S2 of the RF signal 410 and the state S2 of the RF signal 410 between the times t3a and t4 is a second instance of the state S2 of the RF signal 410.

Figure 4D:
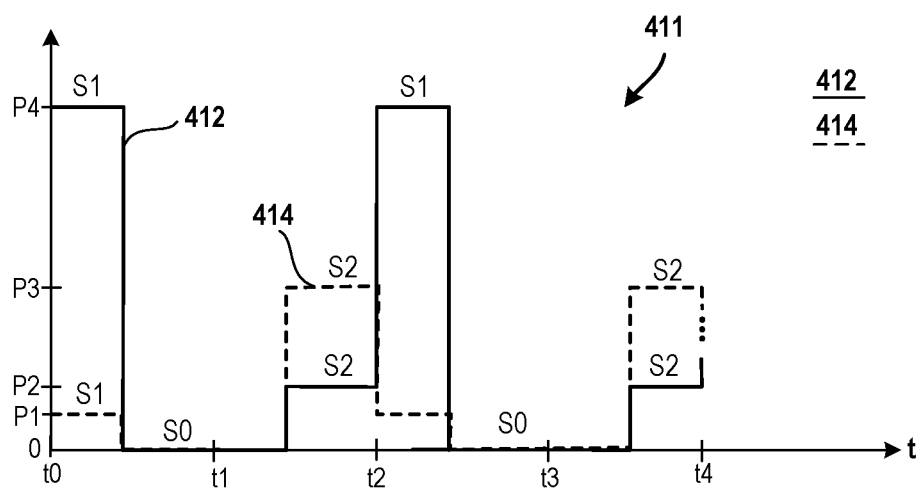
FIG. 4D is an embodiment of a graph to illustrate an embodiment of an RF signal generated by the low frequency RF generator and an embodiment of an RF signal generated by the high frequency RF generator.

FIG. 4D is an embodiment of a graph 411 to illustrate an embodiment of an RF signal 412 generated by the RF generator RFGx (FIG. 1) and an embodiment of an RF signal 414 generated by the RF generator RFGy (FIG. 1). The RF signal 414 is an example of the RF signal 102x (FIG. 1), and the RF signal 416 is an example of the RF signal 102y (FIG. 1).

The graph 411 plots power levels of the RF signals 414 and 416. Also, the graph 411 plots the time t on an x-axis. For example, the x-axis of the graph 411 includes the times t0, t2, t2, t3, and t4. It should be noted that duty cycles of the states S1 through S3 of the RF signals 414 and 416 are different than the duty cycles of the states S1 through S3 illustrated in FIG. 4C. For example, the duty cycle of the state S1 of the RF signals 414 and 416 is 25%, the duty cycle of the state S2 of the RF signals 414 and 416 is 40%, and the duty cycle of the state S3 of the RF signals 414 and 416 is 35%.

Figure 5A:
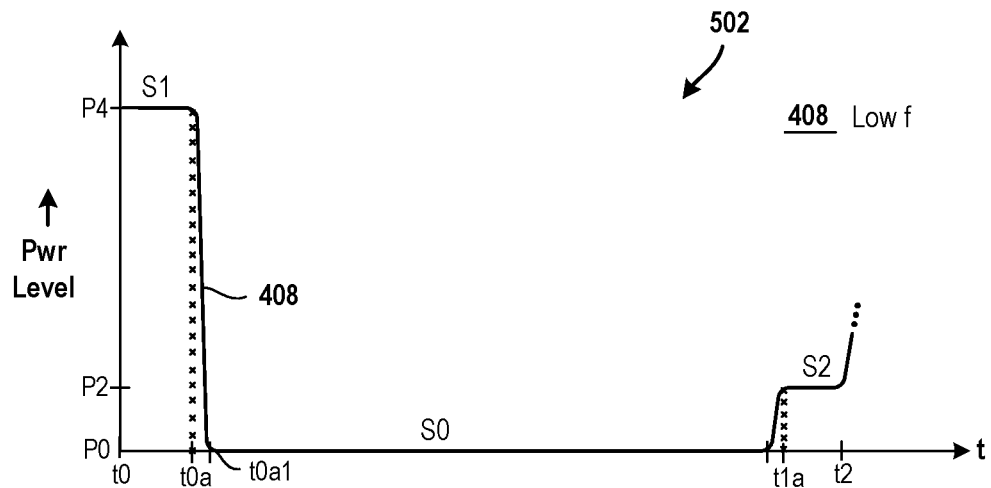
FIG. 5A is an embodiment of a graph to illustrate a zoom-in of a portion of the RF signal, of FIG. 4C, generated by the low frequency RF generator.

FIG. 5A is an embodiment of a graph 502 to illustrate a zoom-in of a portion of the RF signal 408. The graph 502 plots the power levels of the RF signal 408 versus the time t. The RF signal 408 transitions from the power level P4 to the power level P0 within a time window from the time t0a. For example, the RF signal 408 transitions from the power level P4 to the power level P0 during a time period between the time t0a and the time t0a1. The time t0a1 occurs during the state S0 of the RF signal 408 and the digital pulsed signal 404 (FIG. 4B) and occurs between the times t0a and t1a. Similarly, the RF signal 408 transitions from the power level P0 to the power level P2 within a time window from the time t1a.

Figure 5B:
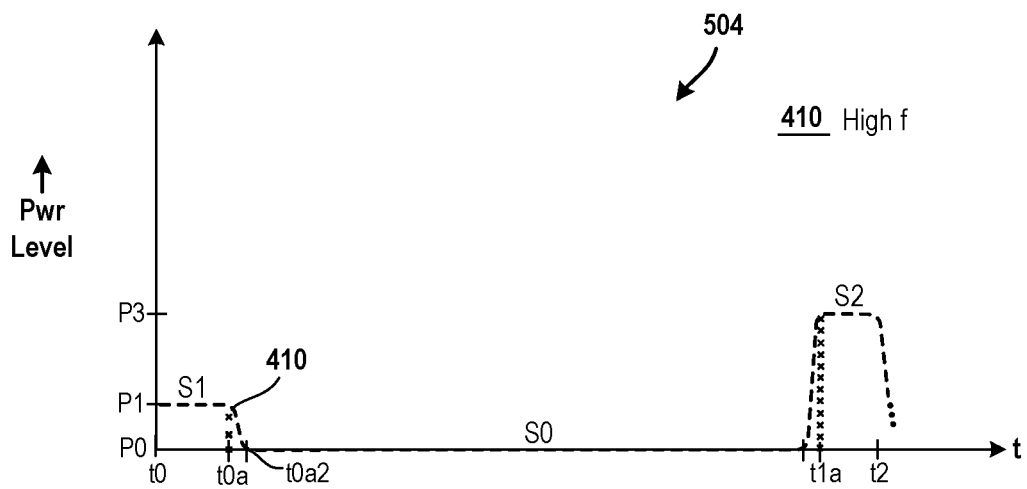
FIG. 5B is an embodiment of a graph to illustrate a zoom-in of a portion of the RF signal, of FIG. 4C, generated by the high frequency RF generator.

FIG. 5B is an embodiment of a graph 504 to illustrate a zoom-in of a portion of the RF signal 410. The graph 504 plots the power levels of the RF signal 410 versus the time t. The RF signal 410 transitions from the power level P1 to the power level P0 within a time window from the time t0a. For example, the RF signal 410 transitions from the power level P1 to the power level P0 during a time period between the time t0a and the time t0a2. The time t0a2 occurs during the state S0 of the RF signal 410 and the digital pulsed signal 404 (FIG. 4B), and occurs between the times t0a and t1a. Similarly, the RF signal 214 transitions from the power level P0 to the power level P3 within a time window from the time t1a.

Figure 6:
FIG. 6 is a diagram of an embodiment of a table to illustrate duty cycles associated with the three-states of the RF signals generated by the low frequency RF generator and the high frequency RF generator.

FIG. 6 is a diagram of an embodiment of a table 600 to illustrate duty cycles associated with the states S1, S2, and S0, and power levels during the states S1, S2, and S0. As an example, a duty cycle of the state S1 of the RF signal 102x (FIG. 1) or the digital pulsed signal 108 (FIG. 1) ranges from and including 3% to 25% of a cycle of the clock signal 204 (FIG. 2A). To illustrate, the duty cycle of the state S1 of the RF signal 102x or the digital pulsed signal 108 ranges from and including 3% to 5% of the cycle of the clock signal 204. As another example, a duty cycle of the state S1 of the RF signal 102y (FIG. 1) or the digital pulsed signal 108 ranges from and including 3% to 25% of the cycle of the clock signal 204 (FIG. 2A). To illustrate, the duty cycle of the state S1 of the RF signal 102y or the digital pulsed signal 108 ranges from and including 3% to 5% of the cycle of the clock signal 204.

As yet another example, a duty cycle of the state S2 of the RF signal 102x or the digital pulsed signal 108 ranges from and including 3% to 50% of the cycle of the clock signal 204. To illustrate, the duty cycle of the state S1 of the RF signal 102x or the digital pulsed signal 108 ranges from and including 3% to 5% of the cycle of the clock signal 204. As another example, a duty cycle of the state S2 of the RF signal 102y or the digital pulsed signal 108 ranges from and including 3% to 50% of the cycle of the clock signal 204. To illustrate, the duty cycle of the state S2 of the RF signal 102y or the digital pulsed signal 108 ranges from and including 3% to 5% of the cycle of the clock signal 204.

As still another example, a duty cycle of the state S0 of the RF signal 102x or the digital pulsed signal 108 ranges from and including 25% to 94% of the cycle of the clock signal 204. As another example, a duty cycle of the state S2 of the RF signal 102y or the digital pulsed signal 108 ranges from and including 25% to 94% of the cycle of the clock signal 204.

As another example, during the state S1, a ratio between a power level of the RF signal 102x and a power level of the RF signal 102y ranges from and including 6 to 10. To illustrate, a power level of the RF signal 102x is 10 kilowatts (kW) and a power level of the RF signal 102y is 1 kW. It should be noted that the duty cycles of the state S1 of the RF signals 102x and 102y and the power level ratios between the RF signals RF 102x and 102y during the state S1 increases mask selectivity, which is further described below. As yet another example, during the state S2, a ratio between a power level of the RF signal 102x and a power level of the RF signal 102y ranges from and including 0.2 to 1. As another example, during the state S2, a ratio between a power level of the RF signal 102x and a power level of the RF signal 102y ranges from and including 0.2 to less than 1.

An example of the ratio less than one is 0.4 or 0.45 or 0.5 or 0.8 or 0.9. To illustrate, during the state S2, a power level of the RF signal 102x is 2 kW and a power level of the RF signal 102y is 5 kW. As another illustration, during the state S2, a power level of the RF signal 102x is between 20% and 100% of the power level of the RF signal 102y. As yet another illustration, during the state S2, a power level of the RF signal 102x is between 20% and less than 100% of the power level of the RF signal 102y. As another illustration, during the state S2, a power level of the RF signal 102x is not approximately zero and a power level of the RF signal 102y is not approximately zero. To further illustrate, a power level of the RF signal 102x during the state S2 does not range between 0 and 300 watts and a power level of the RF signal 102y during the state S2 does not range between 0 and 300 watts. It should be noted that the duty cycles of the state S2 of the RF signals 102x and 102y and the power level ratios between the RF signals RF 102x and 102y during the state S2 increases bow passivation, which is further described below. As another example, during the state S0, a power level of the RF signal 102x ranges from and including 0 watts to 300 watts, and a power level of the RF signal 102y ranges from and including 0 watts to 300 watts.

It should be noted that the power levels of the RF signals 102x and 102y during the state S0 of the RF signals 102x and 102y are approximately equal. For example, the power levels of the RF signals 102x and 102y during the state S0 of the RF signals 102x and 102y are within a pre-determined range from each other. To illustrate, the power level of the RF signal 102x during the state S0 of the RF signal 102x ranges between 0 and 300 watts and the power level of the RF signal 102y during the state S0 of the RF signal 102y ranges between 0 and 300 watts. As another example, the power levels of the RF signals 102x and 102y during the state S0 of the RF signals 102x and 102y are zero.

It should further be noted that a sum or a total of the duty cycles of the states S1 through S3 of the RF signal 102x is equal to 100 percent of a clock cycle of the clock signal 204. For example, first instances of the states S1, S2, and S0 of each of the RF signals 102x and 102y occupy the cycle 1 (FIG. 2A) of the clock signal 204 and second instances of the states S1, S2, and S0 of each of the RF signals 102x and 102y occupy the cycle 2 (FIG. 2A) of the clock signal 204.

In one embodiment, a duty cycle of a state of an RF signal is a time period during which the RF signal has a unique power level during the time period. For example, the duty cycle of the state S1 of the RF signal 212 is a time period between the times t0 and t0a during which the RF signal 212 has the power level P4. As another example, the duty cycle of the state S2 of the RF signal 212 is a time period between the times t0a and t0b during which the RF signal 212 has the power level P2. As yet another example, the duty cycle of the state S0 of the RF signal 212 is a time period between the times t0b and t2 during which the RF signal 212 has the power level P0. As another example, the duty cycle of the state S1 of the RF signal 214 for the state S1 is a time period between the times t0 and t0a during which the RF signal 214 has the power level P1. As still another example, the duty cycle of the state S2 of the RF signal 214 is a time period between the times t0a and t0b during which the RF signal 214 has the power level P3. As yet another example, the duty cycle of the state S0 of the RF signal 214 is a time period between the times t0b and t2 during which the RF signal 214 has the power level P0.

Figure 7A:
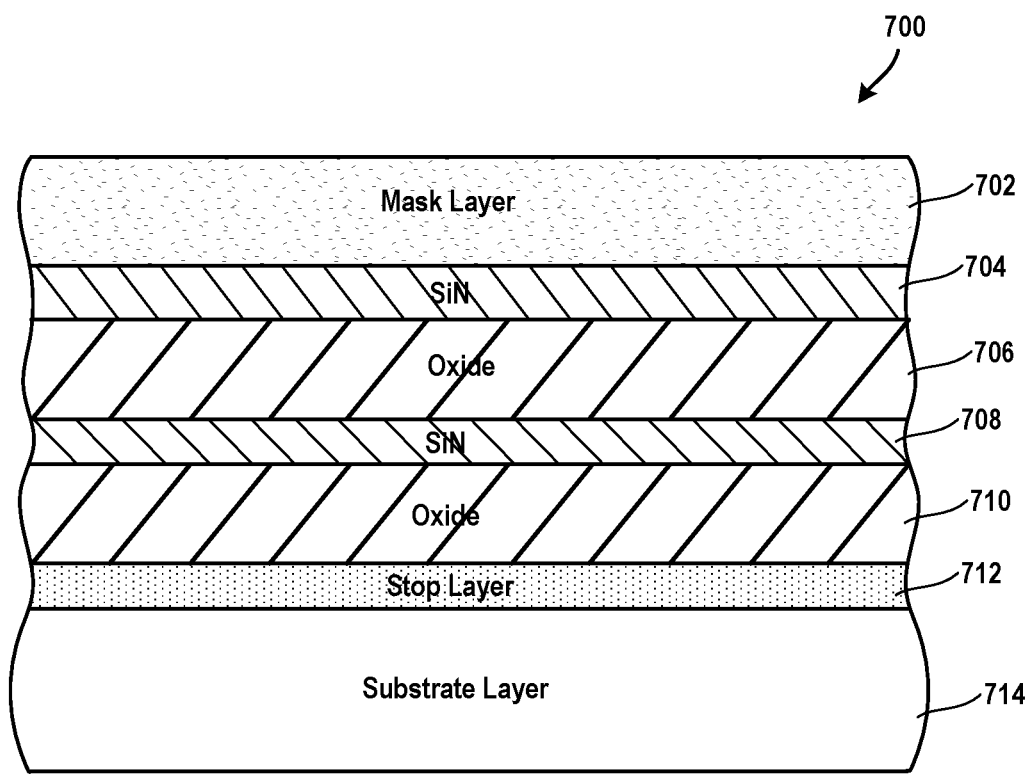
FIG. 7A is a diagram of an embodiment of a substrate stack before processing the substrate stack.

FIG. 7A is a diagram of an embodiment of a substrate stack 700. The substrate stack 700 is an example of the substrate S before being processed in the plasma chamber 106 (FIG. 1). The substrate stack 700 includes a substrate layer 714, made from silicon. The substrate stack 700 further includes a stop layer 712 overlaid on top of the substrate layer 714. An example of the stop layer 712 is an etch stop layer that is fabricated from a dielectric, such as an oxide or nitride. An oxide layer 710 is deposited on top of the stop layer 712. Also, a silicon nitride (SiN) layer 708 is overlaid on top of the oxide layer 710, an oxide layer 706 is deposited on top of the silicon nitride layer 708, another silicon nitride layer 704 is deposited on top of the oxide layer 706, and a mask layer 702 is deposited on top of the silicon nitride layer 704. The mask layer 702 is a photolithography mask, which is an opaque plate or film.

In an embodiment, instead of the oxide layer 706, a nitride layer is used. Similarly, in one embodiment, instead of the oxide layer 710, a nitride layer is used.

Figure 7B:
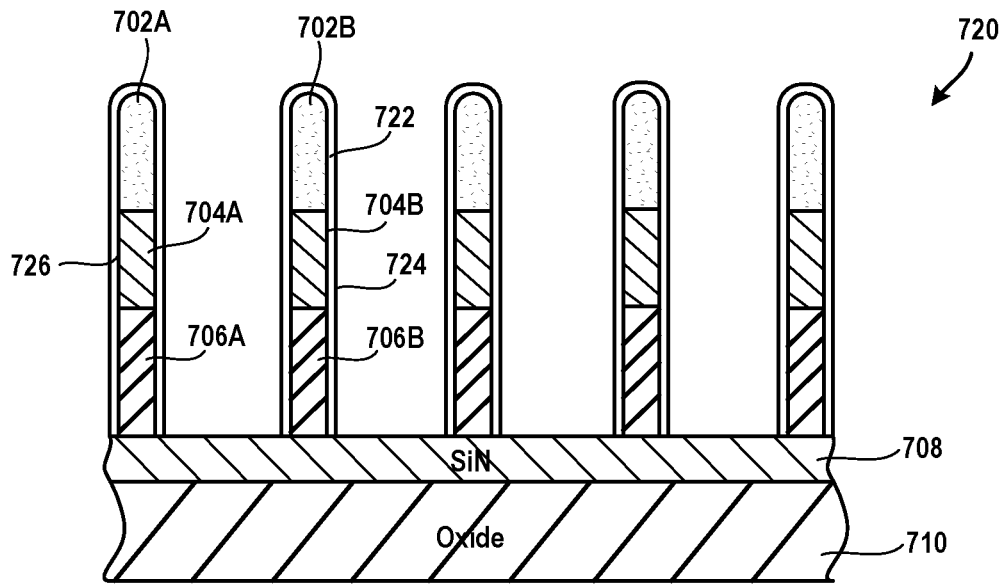
FIG. 7B is a diagram of another embodiment of a substrate stack during processing.

FIG. 7B is a diagram of an embodiment of a substrate stack 720 to illustrate a balance between a passivation layer 722 deposited on a feature 702B of the mask layer 702 (FIG. 7A) and a passivation layer 724 deposited on a feature 704B of the silicon nitride layer 704 (FIG. 7A). The substrate stack 720 includes a feature 702A of the mask layer 702, the feature 702B, a feature 704A of the silicon nitride layer 704, the feature 704B, features 706A and 706B of the oxide layer 706 (FIG. 7A), the silicon nitride layer 708, and the oxide layer 710. The remaining layers 712 and 714 (FIG. 7A) of the substrate stack 720 are not shown in FIG. 7B.

The substrate stack 720 is fabricated by etching the substrate stack 700 of FIG. 7A within the plasma chamber 106 (FIG. 1). The substrate stack 720 is an example of the substrate S (FIG. 1) after some etching of the substrate stack 700. By supplying the combined modified RF signal 124 (FIG. 1) that is generated based on the RF signals $102x$ and $102y$ (FIG. 1) to the plasma chamber 106, the substrate stack 700 is etched to achieve a balance between the passivation layer 722 and the passivation layer 724. For example, the balance between the passivation layers 722 and 724 is achieved when the passivation layers 722 and 724 are deposited in a substantially equal manner to cover the respective features of the mask layer 702 and the silicon nitride layer 704. To illustrate, a width of the passivation layer 722 is substantially equal to a width of the passivation layer 724.

The substantially equal passivation of the passivation layer 724 results in bow control. For example, because of the substantially equal passivation of the passivation layer 724, a bow is not formed on sidewalls of the features of the silicon nitride layer 704. As an example, a passivation layer is a layer that is deposited on or around another layer when the modified RF signal 124 is applied to the substrate S. To illustrate, the passivation layers 722 and 724 include a combination of materials, such as silicon nitride and oxide, that are a part of the substrate stack 720, and a combination of materials of the one or more process gases.

In two-state pulsing, an RF signal periodically alternates between a first state and a second state during one clock cycle of a clock signal. During the first state of the two-state pulsing, there is high mask selectivity, a high level of passivation of the feature 702B, and negligible or minimal passivation of the feature 704B. Also, during the first state, because of the high level of passivation of the feature 702B and because of the negligible or minimal passivation of the feature 704B, a bow is created in the feature 704B. The bow is undesirable. Moreover, in the second state of the two-state pulsing, there is lower mask selectivity compared to the first state, a high level of passivation of the feature 704B, and minimal or negligible passivation of the feature 702B. As such, during the two-state pulsing, there is a lack of balance between passivation of the feature 702B and passivation of the feature 704B and the bow is created. The lack of balance occurs because there is a comparatively high amount of passivation of the feature 702B compared to the feature 704B during the first state and a comparatively high amount of passivation of the feature 704B compared to the feature 704A during the second state. By pulsing the RF signals $102x$ and $102y$ in a manner illustrated with reference to FIGS. 2A-2C or FIGS. 4A-4C, the balance between passivation of the features 702B and 704B is achieved and the bow is reduced or not created.

In addition, the pulsing of the RF signals $102x$ and $102y$ illustrated with reference to FIG. 2A-2C or 4A-4C increases mask selectivity compared to the two-state pulsing. An example of the mask selectivity includes a ratio of an etch rate of etching any of the layers 704-710 of the substrate stack 700 (FIG. 7A) compared to an etch rate of etching of the mask layer 702. The greater the mask selectivity, the faster the substrate stack 700 (FIG. 7A) is etched and the lower the mask selectivity, the slower the substrate stack 700 is etched.

The pulsing of the RF signals $102x$ and $102y$ illustrated with reference to FIG. 2A-2C or 4A-4C facilitates achieving a balance between the mask selectivity and bow control. The bow control is achieved by passivation of sidewalls, such as a sidewall 734, of features of the silicon nitride layer 704. For example, a lower amount of passivation of the mask layer 702 achieved by pulsing the RF signals $102x$ and $102y$ in a manner illustrated with reference to FIG. 2A-2C or 4A-4C compared to that achieved by the two-state pulsing increases the mask selectivity. Moreover, an increased amount of passivation of the sidewalls of the features created by etching the silicon nitride layer 704 is achieved with the combined modified RF signal 124 (FIG. 1) compared to an amount of passivation of the sidewalls achieved by applying the two-state pulsing. The increased amount of passivation of the sidewalls of the features created by etching the silicon nitride layer 704 reduces or eliminates bows within the sidewalls of the features created by etching the silicon nitride layer 704 and the reduction or elimination of the bows increases the mask selectivity.

The pulsing of the RF signals $102x$ and $102y$ facilitates bow control and mask selectivity to be realized concurrently. By managing the pulsing of the RF signals $102x$ and $102y$, an optimal balance can be achieved to effect both bow control and mask selectivity, while minimizing any trade-offs or compromises associated with the two-state pulsing.

Figure 7C:
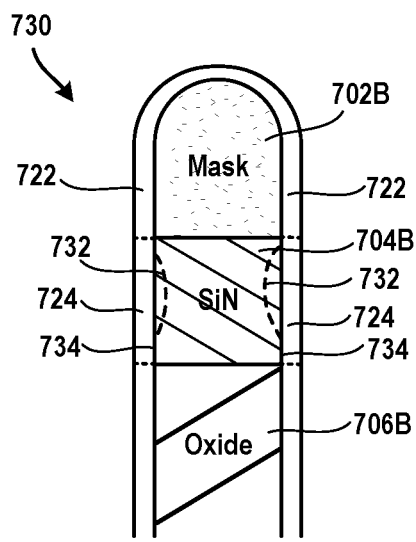
FIG. 7C is a diagram of a portion of the substrate stack of FIG. 7B.

FIG. 7C is a zoom-in view of a portion 730 of the substrate stack 720 (FIG. 7B). The portion 730 includes the feature 702B of the mask layer 702 (FIG. 7A), the feature 704B of the silicon nitride layer 704 (FIG. 7A), and the feature 706B of the oxide layer 706 (FIG. 7A). Also illustrated in FIG. 7C is a bow 732, that is shown as dashed. The bow 732 is created on the sidewall 734 of the feature 704B. The sidewall 734 of the feature 704B faces a sidewall 726 (FIG. 7B) of the feature 704A and a gap is created between the sidewalls 726 and 734 when the substrate stack 700 (FIG. 7A) is etched. It should be noted that the bow 732 is created when the two-state pulsing is applied to the substrate S. However, the bow 732 is reduced or not created when the pulsing of the RF signals $102x$ and $102y$ illustrated with reference to FIG. 2A-2C or 4A-4C is applied to the substrate S via the combined modified RF signal 124 (FIG. 1). The bow 732 is reduced or not created when a balance between passivation of the features 702B and 704B is achieved with the pulsing of the RF signals 102x and 102y, illustrated with reference to FIGS. 2A-2C and 4A-4C.

Bow control is achieved when the bow 732 is reduced or not created so as to achieve or maintain a pre-determined critical dimension. For example, the pre-determined critical dimension (CD), which is a pre-determined width between the sidewall 734 of the feature 704B and a sidewall, similar to the sidewall 734, of the feature 704A of the silicon nitride layer 704 is achieved due to effective bow control. The pre-determined width is less than a width, such as a horizontal distance, between the bow 732 and a bow, similar to the bow, created within the sidewall of the feature 704A.

Figure 7D:
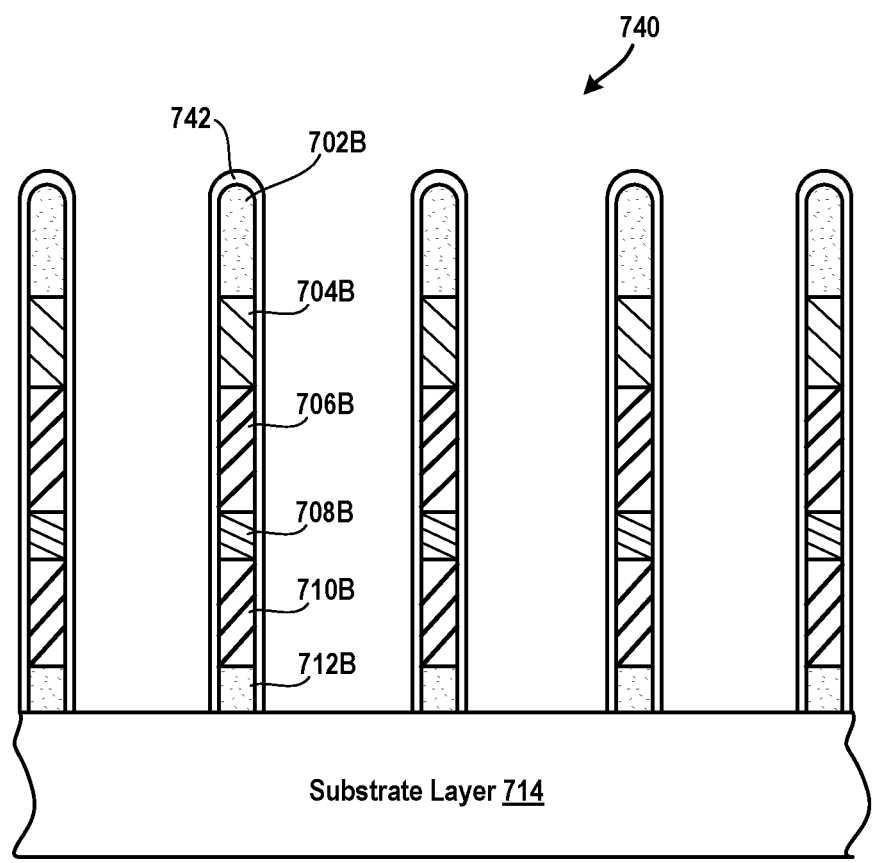
FIG. 7D is a diagram of yet another embodiment of a substrate stack after processing the substrate stack of FIG. 7A.

FIG. 7D is a diagram of an embodiment of a substrate stack 740 after processing the substrate stack 700 (FIG. 7A) by applying the method illustrated with reference to FIGS. 2A-2C or FIGS. 4A-4C. The substrate stack 740 is an example of the substrate stack S after pulsing of the RF signals 102x and 102y illustrated with reference to FIGS. 2A-2C or FIGS. 4A-4C is applied to the substrate stack 700.

The substrate stack 740 includes features of the mask layer 702 (FIG. 7A), features of the silicon nitride layer 704 (FIG. 7A), features of the oxide layer 706 (FIG. 7A), features of the silicon nitride layer 708 (FIG. 7A), features of the oxide layer 710 (FIG. 7A), and features of the stop layer 712 (FIG. 7A). A passivation layer 742, which includes multiple passivation portions, such as the passivation layer 722 (FIG. 7C) and the passivation layer 724 (FIG. 7C), is deposited on the features 702B, 704B, 706B, a feature 708B of the silicon nitride layer 708, a feature 710B of the oxide layer 710, and a feature 712B of the stop layer 712. The passivation layer 742 is deposited when the combined modified RF signal 124 that is generated based on the RF signals 102x and 102y illustrated with reference to FIGS. 2A-2C or FIGS. 4A-4C is applied to the substrate stack 700.

FIG. 8 is a high level flow chart of an embodiment. A stack is provided (step 804). FIG. 9A is a schematic cross-sectional view of a stack 904 processed according to an embodiment. The stack 904 comprises a substrate 908. One or more intermediate layers 912, such as an etch stop layer, may be over the substrate 908. A first silicon oxide ($SiO_2$) layer 916 is over the one or more intermediate layers 912. A first silicon nitride (SiN) layer 920 is over the first $SiO_2$ layer 916. A second $SiO_2$ layer 924 is over the first SiN layer 920. A second SiN layer 928 is over the second $SiO_2$ layer 924. A patterned mask 932 is over the second SiN layer 928. In various embodiments, one or more layers may be between the patterned mask 932 and the second SiN layer 928. Various embodiments may have additional alternating SiN layers and $SiO_2$ layers. Other embodiments may have layers of other materials. In various embodiments, the stack 904 has silicon containing layers. In this embodiment the patterned mask 932 is a hardmask, such as polysilicon.

The stack 904 may be placed in the plasma chamber 106. An etch gas is flowed into the plasma chamber 106 (step 808). In this embodiment, the etch gas comprises a metal fluoride or tungsten containing passivant and an etch component. In this embodiment, the metal fluoride or tungsten containing passivant is tungsten hexafluoride ($WF_6$). In this embodiment, the etch component comprises oxygen ($O_2$) and a fluorocarbon, such as hexafluorobutadiene ($C_4F_6$) and/or octafluorocyclobutane ($C_4F_8$).

A multi-state pulsing scheme is effected to form the etch gas into a plasma that etches the stack 904. In this embodiment, the multi-state pulsing scheme comprises generating a primary RF signal at a first frequency range and a secondary RF signal at a second frequency range where the first frequency range is less than the second frequency range. The primary RF signal and the secondary RF signal pulse among at least three states, including a first state, a second state, and a third state. In an example, the primary RF signal has a frequency of 400 kHz and the secondary RF signal has a frequency of 60 MHz. The first state has a duty cycle of 3% to 20%, where the primary RF signal has a power level of 17 kW to 30 kW and the secondary RF signal has a power level of greater than 5 kW. In a more specific example, the first state has a duty cycle of 3% to 5%, where the primary RF has a power level of 29 kW. The second state has a duty cycle of 3% to 40%, where the primary RF signal has a power level of greater than 8 kW and the secondary RF signal has a power level of greater than 3 kW. In a more specific example, the second state has a duty cycle of 3% to 5%, where the primary RF signal has a power level of 13 kW and the secondary RF signal has a power level of 5 kW. The third state has a duty cycle of 40% to 94%, where the primary RF signal has a power level of less than 2 kW and the secondary RF signal has a power level of 1 kW. In a specific example, the third state has a duty cycle of 90% to 94%, where the primary RF signal has a power level of 0 kW and the secondary RF signal has a power level of 0 kW. In an embodiment, a ratio of the power level of the primary RF signal during the first state to the power level of the secondary RF signal during the first state is greater than 1, and a ratio of the power level of the primary RF signal during the second state to the power level of the secondary RF signal during the second state is less than 1.

FIG. 9B is a schematic cross-sectional view of a stack 904 after the etch is completed. Features 940 have been etched into the stack 904 by the etch process of the flowing the etch gas (step 808) and providing the multi-state pulsing scheme described above. In this embodiment, the features 940 are contact holes. In this embodiment, a single etch recipe is able to selectively etch the first and second silicon oxide layers 916, 924 and the first and second silicon nitride layers 920, 928. Without the metal fluoride or tungsten-containing passivant, bowing indicated by dotted lines 948 may result. The addition of the metal fluoride or tungsten containing passivant alone would cause necking as indicated by dotted lines 944. The combination of the metal fluoride or tungsten-containing passivant and the multi-state pulsing scheme provides a tuning that is able to prevent necking and bowing with a high etch selectivity at the same time. It is believed that the multi-state pulsing scheme of the embodiment with three power levels provides an ion flux and bias energy that is able to prevent necking while using a metal fluoride or tungsten-containing passivant. In this embodiment, the etch selectivity for etching the dielectric stack with respect to a polysilicon mask is at least 2 to 1. More specifically, the etch selectivity for etching the dielectric stack with respect to a polysilicon mask is between 2:1 to 3:1.

In other embodiments, the power level of the primary RF signal during the second state is less than 80% of the power level of the primary RF signal during the first state. The power level of the primary RF signal during the third state is less than 20% of the power level of the primary RF signal during the second state. The power level of the secondary RF signal during the third state is less than 20% of the power level of the secondary RF signal during the second state. The first state has a duty cycle of 3% to 25%. The second state has a duty cycle of 3% to 50%. The third state has a duty cycle of 25% to 94%. In some embodiments, the duty cycle of the first state is less than the duty cycle of the third state. The duty cycle of the second state is less than the duty cycle of the third state.

In various embodiments, the first frequency range may be a frequency range between 80 kHz to 14 MHz. The first frequency range is used to create a bias for ion bombardment. The second frequency range may be a frequency range between 15 MHz and 120 MHz. The second frequency range is used to energize the plasma and may be used to control plasma density, ion flux, and degree of plasma dissociation. In various embodiments, the metal fluoride or tungsten-containing passivant is a tungsten fluoride. The tungsten fluoride may include tungsten hexafluoride, tungsten chloride pentafluoride ($WClF_5$), and tungsten dichloride tetrafluoride ($WCl_2F_4$). In other embodiments, another tungsten-containing passivant is a tungsten fluoride, $WF_xCl_y$, where x+y=4,5,6, or $WO_xF_y$, where 2x+y=4,5,6. For example, a tungsten-containing passivant may be $WO_2F_2$ or $WOF_4$, or $WCl_2F_4$.

In various embodiments, the stack has at least one silicon oxide layer. The stack comprises a silicon-based layer. In various embodiments, the mask is a hardmask, such as polysilicon. In other embodiments, the stack comprises alternating layers of silicon oxide and silicon nitride. Various embodiments provide high aspect ratio (HAR) features with height to width ratios greater than 20:1.

In various embodiments, the etch gas has a tungsten-containing passivant to total etch gas flow rate ratio of between 1 to 10 and 1 to 100, by number of moles.

Figure 10:
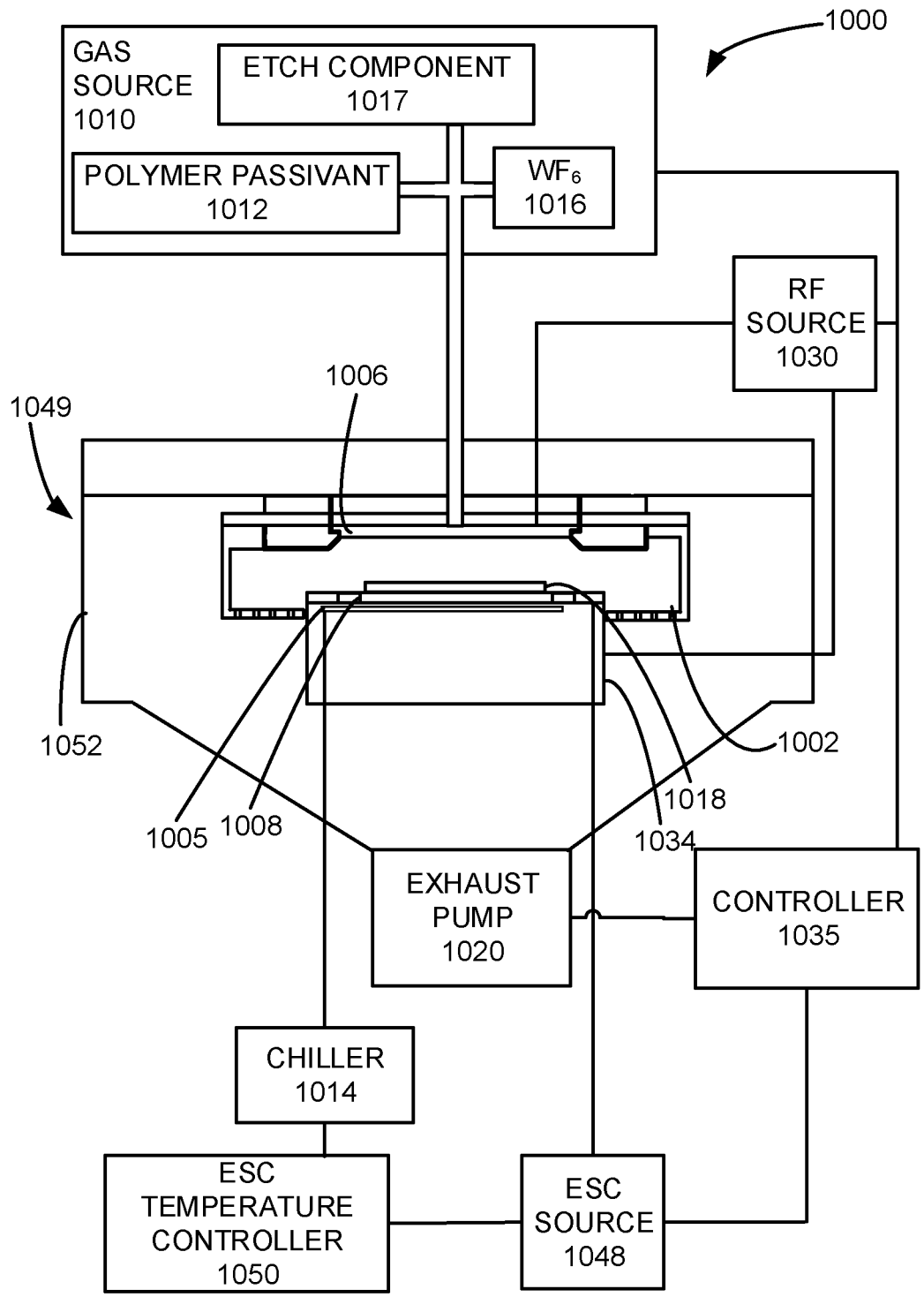
FIG. 10 is a schematic view of plasma processing system used in an embodiment.

FIG. 10 is a schematic view of an etch reactor that may be used in an embodiment. In one or more embodiments, a plasma processing system 1000 comprises a gas distribution plate 1006 providing a gas inlet and an electrostatic chuck (ESC) 1008, within a plasma processing chamber 1049, enclosed by a chamber wall 1052. Within the plasma processing chamber 1049, a stack 1018 is positioned on over the ESC 1008. The ESC 1008 may provide a bias from the ESC source 1048. The primary RF signal from the ESC source 1048 provides a bias at the ESC 1008. An etch gas source 1010 is connected to the plasma processing chamber 1049 through the gas distribution plate 1006. In this embodiment, the etch gas source 1010 may comprise a polymer passivant source 1012, an etch component gas source 1017, and a $WF_6$ (or tungsten-containing passivant) source 1016. An ESC temperature controller 1050 is connected to a chiller 1014. In this embodiment, the chiller 1014 provides a coolant to channels 1005 in or near the ESC 1008. A radio frequency (RF) source 1030 provides RF power to a lower electrode and/or an upper electrode, which in this embodiment are the ESC 1008 and the gas distribution plate 1006. In this embodiment, the secondary RF signal may be provided by the RF source 1030. The secondary RF signal may be used to provide energy to form a plasma. In an exemplary embodiment, 400 kHz, 60 MHz, and optionally 2 MHz, 27 MHz power sources make up the RF source 1030 and the ESC source 1048. The RF source 1030 and the ESC source 1048 may include the RF generator RFGx, the RF generator RFGy, and the impedance matching network IMN, shown in FIG. 1. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 1035 is controllably connected to the RF source 1030, the ESC source 1048, an exhaust pump 1020, and the etch gas source 1010. An example of such an etch chamber is a modified Exelan Flex™ etch system manufactured by Lam Research Corporation of Fremont, CA The process chamber can be a CCP (capacitively coupled plasma) reactor or an ICP (inductively coupled plasma) reactor. Other embodiments may use other types of plasma processing chambers such as dielectric and conductive etch chambers or deposition chambers.

Other embodiments may have chambers of different dimensions. Such chambers may use different relative powers. For example, a larger chamber may use RF powers as high as or higher than 120 kW. In other embodiments, other states may be added, so that there may be a fourth or fifth state.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, a plasma system, described herein, includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, or any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an X MHz RF generator, a Y MHz RF generator, and a Z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for multi-state pulsing to achieve a balance between bow control and mask selectivity, comprising:
generating a primary radio frequency (RF) signal, wherein the primary RF signal pulses among three states including a first state, a second state, and a third state;
generating a secondary RF signal, wherein the secondary RF signal pulses among the three states,
wherein during the first state, the primary RF signal has a power level that is greater than a power level of the secondary RF signal;
wherein during the second state, the secondary RF signal has a power level that is greater than a power level of the primary RF signal,
wherein during the third state, power levels of the primary and secondary RF signals are within a pre-determined range.

2. The method of claim 1, wherein a duty cycle of the first state is less than a duty cycle of the third state, wherein a duty cycle of the second state is less than the duty cycle of the third state.

3. The method of claim 2, wherein the duty cycle of the first state ranges between three percent and twenty-five percent of a clock cycle of a clock signal.

4. The method of claim 3, wherein the duty cycle of the second state ranges between three percent and fifty percent of the clock cycle of the clock signal.

5. The method of claim 4, wherein the duty cycle of the third state ranges between twenty five percent and ninety four percent of the clock cycle of the clock signal, wherein a sum of the duty cycles of the first, second, and third states is equal to one-hundred percent of the clock cycle.

6. The method of claim 2, wherein the power level of the primary RF signal during the first state, the power level of the secondary RF signal during the second state, the duty cycle of the first state, and the duty cycle of the second state facilitate achieving the balance between bow control and the mask selectivity.

7. The method of claim 1, further comprising:
supplying the primary RF signal to an impedance matching network, wherein the impedance matching network is coupled to an electrode of a plasma chamber;
supplying the secondary RF signal to the impedance matching network.

8. The method of claim 1, wherein the power level of the primary RF signal during the first state is greater than the power level of the secondary RF signal during the first state by at least six times and at most ten times.

9. The method of claim 1, wherein the power level of the primary RF signal during the second state is at least twenty percent and at most less than one hundred percent of the power level of the secondary RF signal during the second state.

10. The method of claim 1, wherein the power levels of the primary and secondary RF signals during the third state are zero.

11. The method of claim 1, wherein the primary RF signal pulses from the power level of the first state to the power level of the second state, pulses from the power level of the second state to the power level of the third state, and pulses from the power level of the third state to the power level of the first state.

12. The method of claim 1, wherein the first RF signal pulses among the three power levels in synchronization with the three states of a digital pulsed signal.

13. A method for etching a stack below a mask in a plasma processing chamber, comprising:
flowing an etch gas comprising a metal fluoride or a tungsten-containing passivant and an etch component into the plasma processing chamber; and
transforming the etch gas into a plasma, comprising:
generating a primary radio frequency (RF) signal at a first frequency range, wherein the primary RF signal pulses among at least three states including a first state, a second state, and a third state; and
generating a secondary RF signal at a second frequency range, wherein the secondary RF signal pulses among the at least three states and wherein the first frequency range is less than the second frequency range;
wherein during the second state, the primary RF signal has a power level that is less than 80% of a power level of the primary RF signal during the first state;
wherein during the third state, the primary RF signal has a power level that is less than 20% of the power level of the primary RF signal during the second state; and
wherein during the third state, a power level of the secondary RF signal is less than 20% of a power level of the secondary RF signal during the second state.

14. The method of claim 13, wherein a duty cycle of the first state is less than a duty cycle of the third state, wherein a duty cycle of the second state is less than the duty cycle of the third state.

15. The method of claim 13, wherein the duty cycle of the first state ranges between three percent and twenty-five percent of a clock cycle of a clock signal.

16. The method of claim 15, wherein the duty cycle of the second state ranges between three percent and fifty percent of the clock cycle of the clock signal.

17. The method of claim 16, wherein the duty cycle of the third state ranges between twenty-five percent and ninety-four percent of the clock cycle of the clock signal, wherein a sum of the duty cycles of the first, second, and third states is equal to one-hundred percent of the clock cycle.

18. The method of claim 13, wherein the first frequency range is between 80 kHz and 14 MHz, inclusive, and wherein the second frequency range is between 15 MHz and 120 MHz, inclusive.

19. The method of claim 13, wherein the metal fluoride or the tungsten-containing passivant is tungsten fluoride.

20. The method of claim 13, wherein the metal fluoride or the tungsten-containing passivant is tungsten hexafluoride.

21. The method of claim 13, wherein the stack comprises silicon.

22. The method of claim 21, wherein the mask is a hardmask.

23. The method of claim 22, wherein the hardmask comprises polysilicon.

24. The method of claim 23, wherein the stack comprises at least one silicon oxide containing layer.

25. The method, as recited in claim 13, wherein a ratio of the power level of the primary RF signal during the first state to the power level of the secondary RF signal during the first state is greater than 1, and a ratio of the power level of the primary RF signal during the second state to the power level of the secondary RF signal during the second state is less than 1.

26. The method, as recited in claim 13, wherein when the primary RF signal is pulsed among the three states and the secondary RF signal is pulsed among the three states, a multi-state pulsing scheme is applied, wherein the multi-state pulsing scheme is tuned to minimize necking and bowing with the metal fluoride or the tungsten-containing passivant.

* * * * *